United States Patent [19]
Ushiku et al.

[11] Patent Number: 5,675,176
[45] Date of Patent: Oct. 7, 1997

[54] SEMICONDUCTOR DEVICE AND A METHOD FOR MANUFACTURING THE SAME

[75] Inventors: Yukihiro Ushiku; Atsushi Yagishita, both of Yokohama; Satoshi Inaba, Tokyo; Minoru Takahashi, Yokohama; Masanori Numano, Yokohama; Yoshiki Hayashi, Yokohama; Yoshiaki Matsushita, Yokohama; Yasunori Okayama, Kawasaki; Hiroyasu Kubota, Yachiyo; Norihiko Tsuchiya, Tokyo, all of Japan

[73] Assignee: Kabushiki Kaisha Toshiba, Kawasaki, Japan

[21] Appl. No.: 530,721

[22] Filed: Sep. 15, 1995

[30] Foreign Application Priority Data

Sep. 16, 1994 [JP] Japan .................................. 6-222018
Jun. 26, 1995 [JP] Japan .................................. 7-159448
Sep. 11, 1995 [JP] Japan .................................. 7-233071

[51] Int. Cl.$^6$ ............................................ H01L 29/30
[52] U.S. Cl. .......................... 257/617; 257/510; 257/513; 257/519; 257/520; 257/618; 257/622; 257/415; 257/418
[58] Field of Search .................. 257/510, 513, 257/519, 520, 374, 617, 618, 622, 415, 418

[56] References Cited

PUBLICATIONS

Fahey et al., "Stress–induced dislocations in silicon integrated circuits" IBM J. Res Develop., vol. 36, No. 2, Mar. 1992, pp. 158–182 Mar. 3, 1992.

S. Matsuda et al., "Three–Dimensional Mechanical Stress Analysis of Trench Isolation along {111} Gliding Planes." Technical Digest of International Electron Devices Meeting, 1994. Jan.

*Primary Examiner*—Edward Wojciechowicz
*Attorney, Agent, or Firm*—Oblon, Spivak, McClelland, Maier & Neustadt, P.C.

[57] ABSTRACT

A semiconductor device has a semiconductor substrate having a groove, and a semiconductor element formed in a surface region of the semiconductor substrate. A substance having a thermal expansion coefficient different from the semiconductor substrate is embedded in at least a portion of the groove, a crystal defect is generated from the region near the bottom of the groove in the semiconductor substrate, thereby alleviating stress and strain in other regions of the semiconductor substrate, such that such regions cannot generate crystal defects in a region necessary for a circuit operation of the semiconductor element of the surface region.

21 Claims, 32 Drawing Sheets

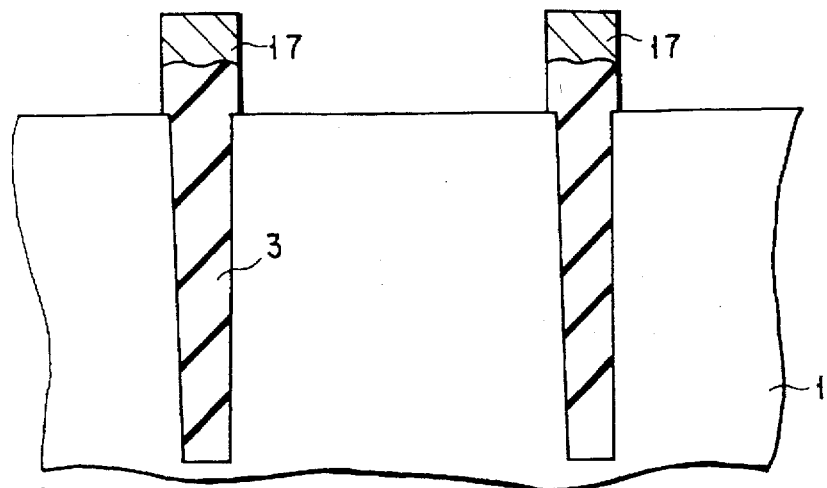
F I G. 6D
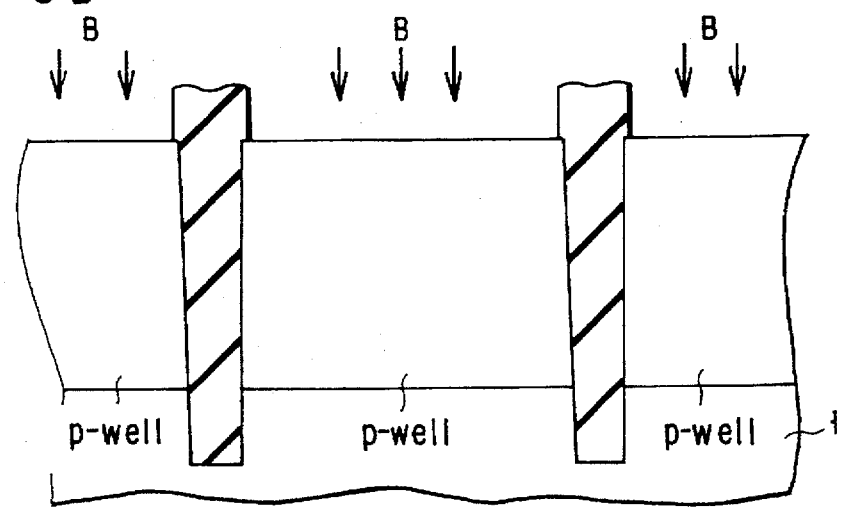
F I G. 6E
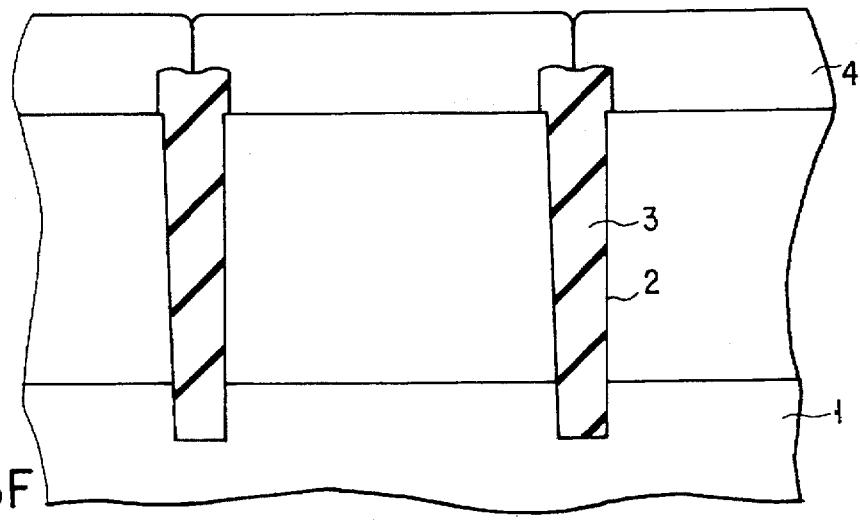
F I G. 6F

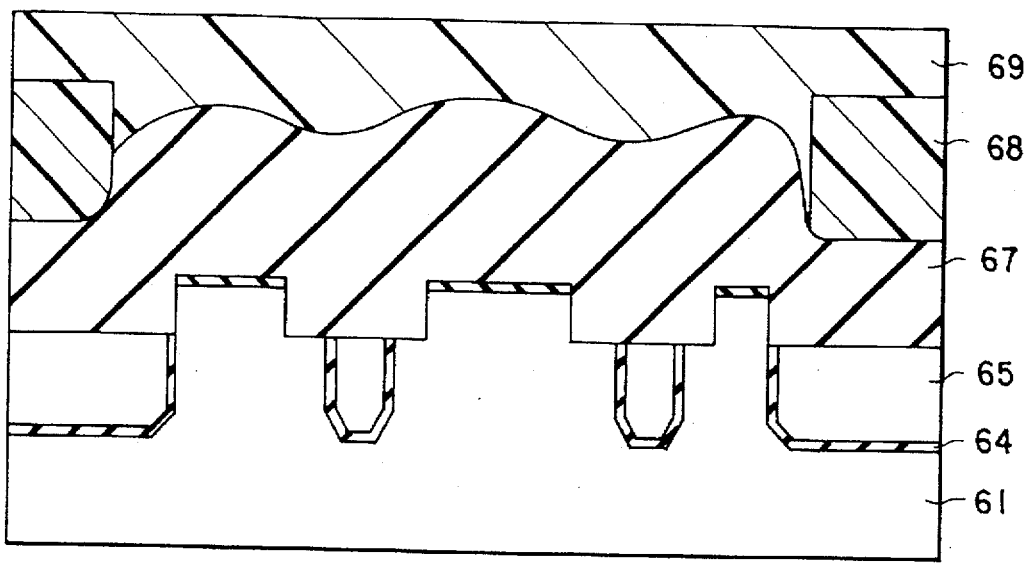
F I G. 9D
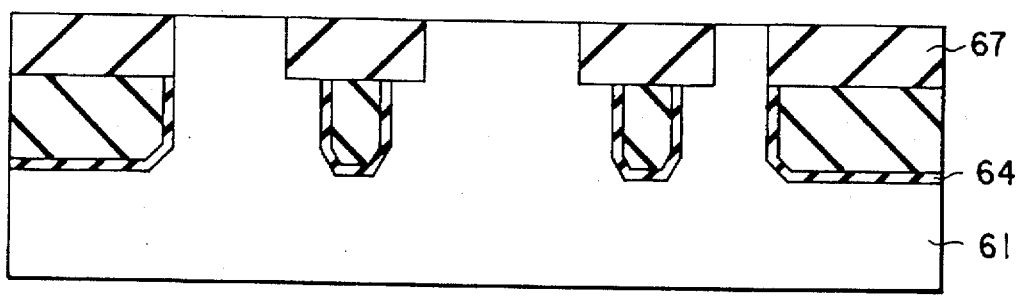
F I G. 9E
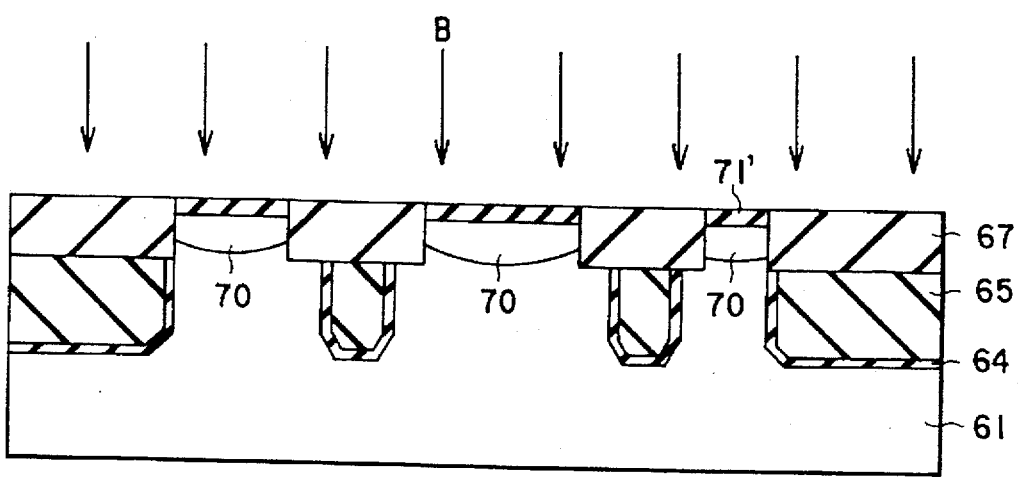
F I G. 9F

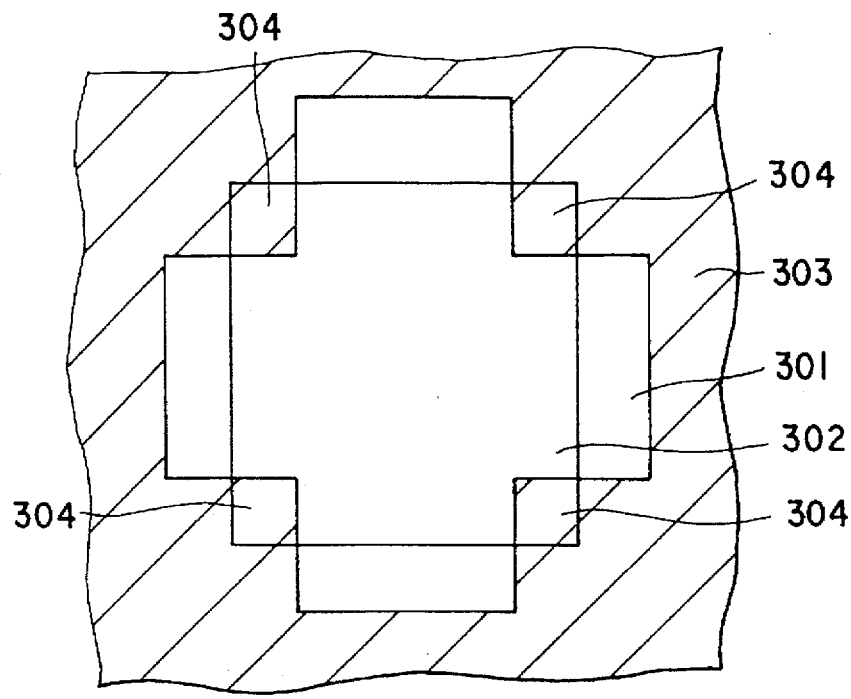
F I G. 12
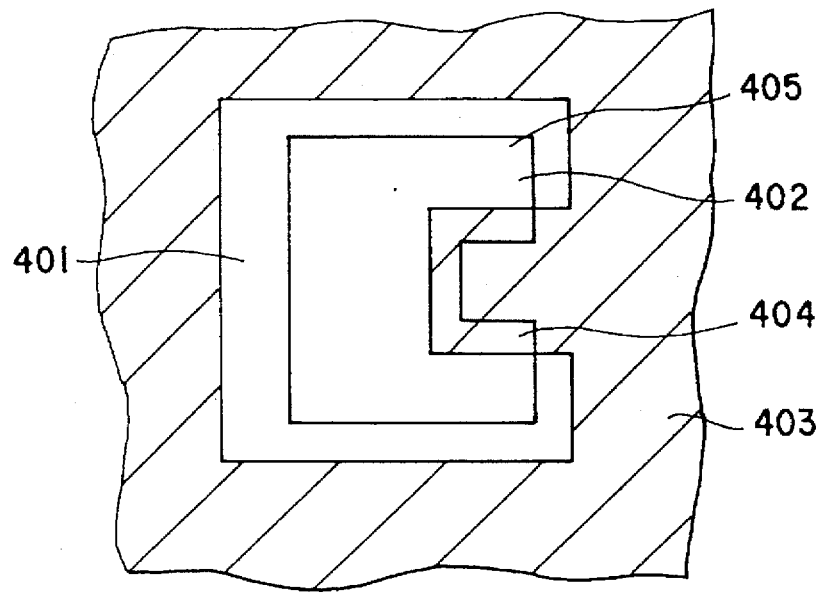
F I G 13

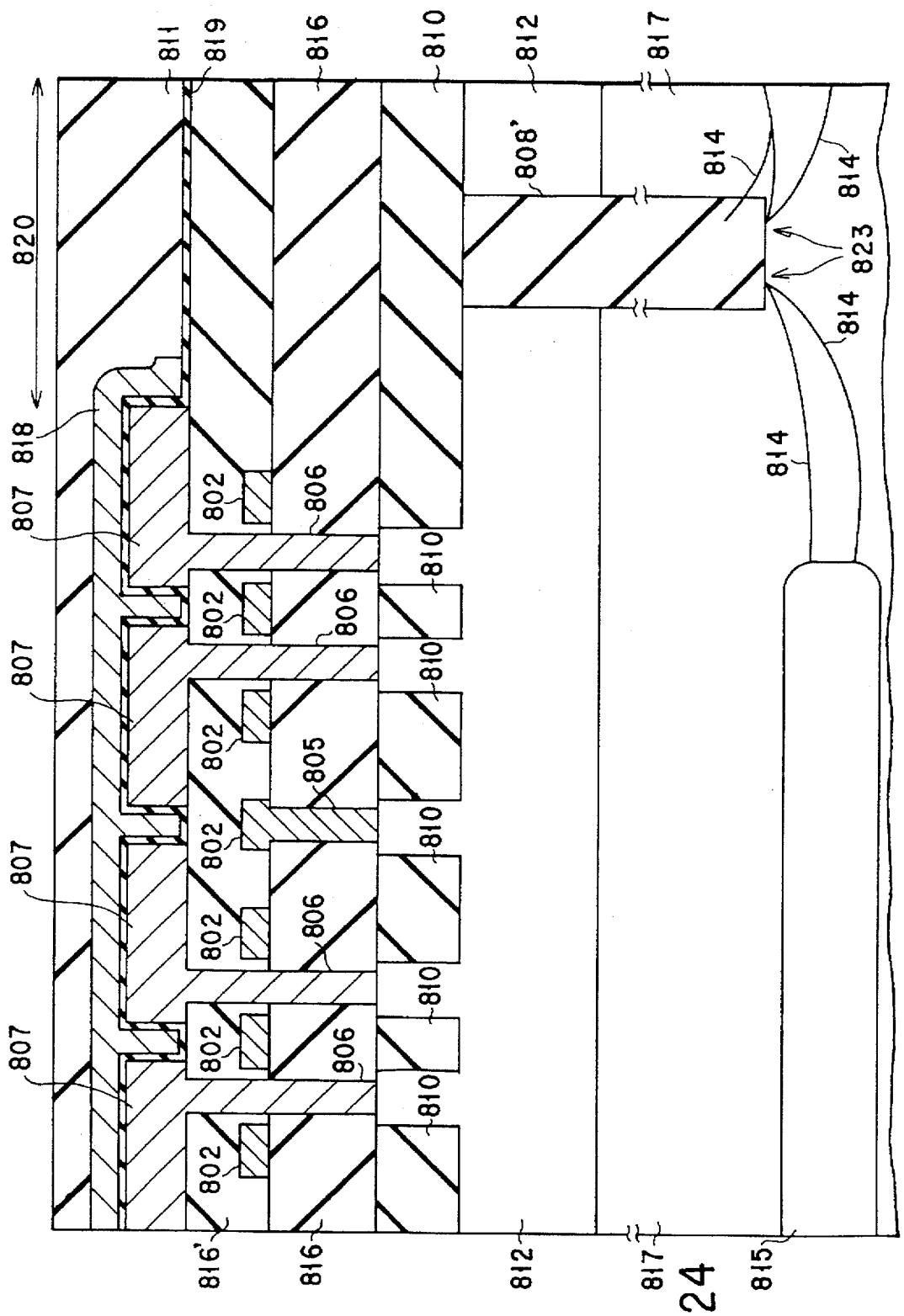
F I G. 24

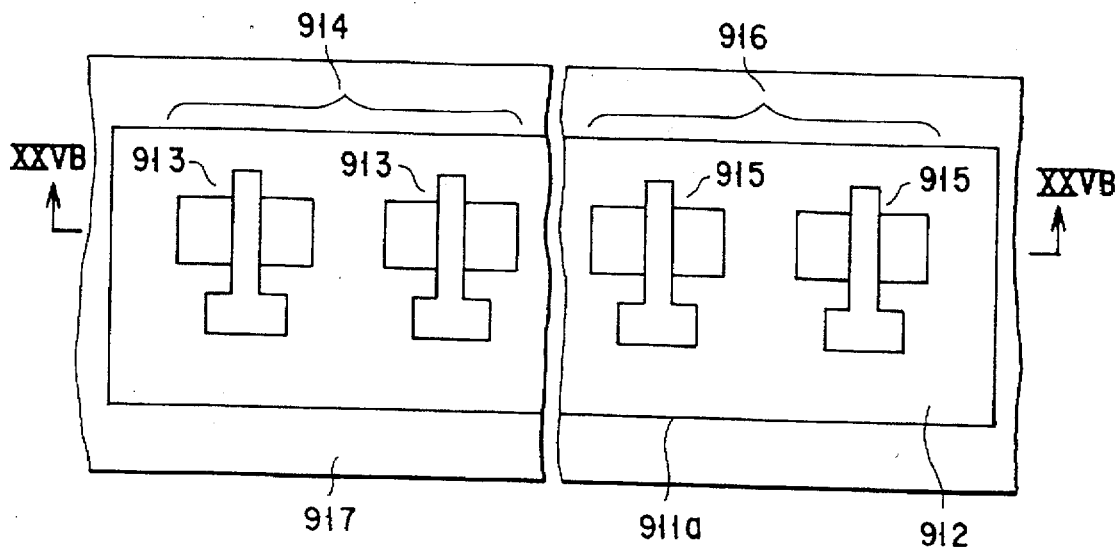
F I G. 25A
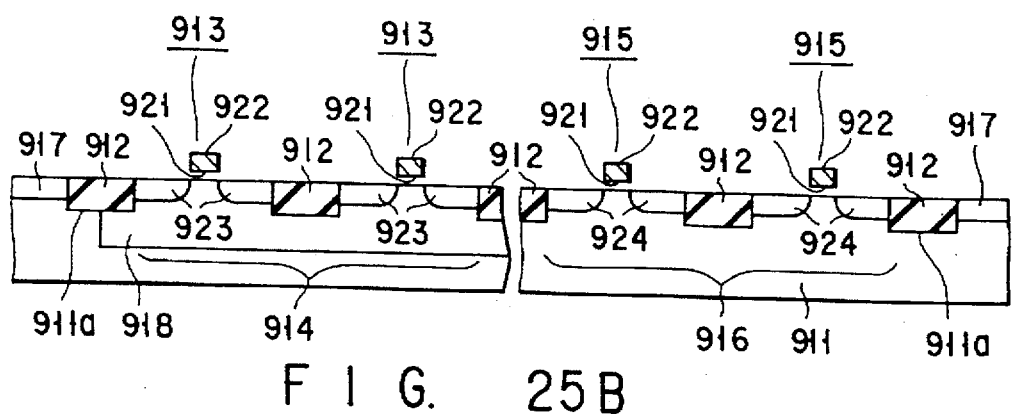
F I G. 25B
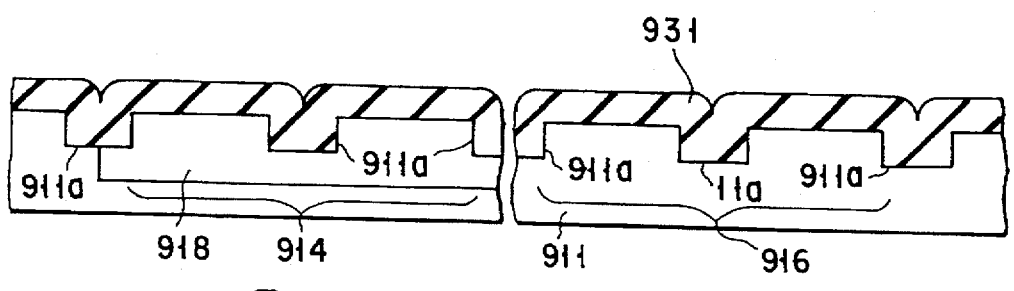
F I G. 26A

SEMICONDUCTOR DEVICE AND A METHOD FOR MANUFACTURING THE SAME

BACKGROUND OF THE INVENTION

1. Field of the Invention

The present invention relates to a semiconductor device and a method for manufacturing the same and, more particularly, to an isolating technique for a device represented by a MIS field effect transistor.

2. Description of the Related Art

It brings about advantages of decreasing an occupied area and simultaneously increasing a driving current of a device to finely form insulated gate field effect transistors formed in a semiconductor substrate and to integrate the transistors. However, to realize the fine structure, various problems occur. One of the problems resides in an electric isolation of devices when the transistors are finely formed.

More particularly, an isolation between semiconductor devices in which a substrate is made of silicon has been executed by an improved LOCOS method for locally forming a silicon oxide film. However, as a miniaturization of the semiconductor device is advanced, it becomes difficult to obtain a sufficient film thickness, since an isolation width is reduced, by means of a conventional method for locally forming an oxide film, and a breakdown voltage between devices is expected to be resultantly deteriorated. Particularly, when a birds beak to disturb the miniaturization is intended to be reduced, a stress to be applied to the substrate at the time of oxidizing is increased, and a crystal defect feasibly occurs in the substrate.

From such a fact, as a new method for isolating devices, a method for isolating devices by forming a groove in an isolation region of a semiconductor substrate and depositing to embed an insulator in the groove has been tried.

However, it has been clarified according to the present inventors' research that a strain due to a stress is accumulated in a heating step during a step of forming devices due to a difference of thermal expansion coefficients between a semiconductor substrate and substance embedded therein and a crystal defect (particularly a large defect of a dislocation and the like) occurs in the semiconductor substrate due to a combination of the strain with the other step, in the above method for isolating using the groove (trench isolation method). More particularly, when the crystal defects crosses a p-n junction formed between impurity diffused regions of the device, a junction leakage current is increased, thereby resulting in no normal operation. This is particularly a fatal disadvantage as a product such as a semiconductor memory device and the like. Therefore, it is necessary that the crystal defect may not cross the p-n junction formed at least within about 0.2 μm from its surface and a depletion layer formed at the p-n junction.

On the other hand, a semiconductor device such as a CMOS has a problem in an isolation between an n-type well and a p-type well. In other words, the trench isolation method intends to isolate the well by forming a deep groove. However, since its width is narrow and the deep groove must be formed, its processing is difficult by prior art, and it becomes a cause of inducing a crystal defect.

Further, the crystal defect is caused by, as de scribed above, not only an isolation but also an ion implantation to an element region.

FIGS. 1A and 1B show a method for implanting an impurity by an ion implantation into an element region by prior art. FIG. 1A shows a plan pattern of a MOS transistor. An element region 102 is isolated by an isolation region 103. A gate electrode 104 is formed on the element region 102. In this transistor, a resist pattern 105 is formed only on an unnecessary portion, and an impurity such as, for example arsenic or the like is implanted into the element region by using the resist pattern 105 and the gate electrode 104 as masks.

FIG. 1B is a cross-sectional view taken along the line IB—IB of FIG. 1A. A trench is formed in the element isolation region 103 of the substrate 101, and the trench is filled with $SiO_2$. The gate electrode 104 is formed on the element region 102, and a portion where an ion implantation is not desired is covered with the resist pattern 105 in this state.

In this case, it is necessary to widen an opening of the resist pattern 105 as compared with the element isolation region 102 by considering an alignment deviation. Thus, the arsenic is implanted in the entire element region 102, and an impurity region 106 is formed in the element region 102 of the substrate 101.

A stress received by the isolation region 103 is concentrated at a corner 107 of the element region 102. Further, a primary defect due to the ion implantation is grown to a large defect due to a dislocation by the concentrated stress, and a problem of an increase of a junction leakage current occurs.

More particularly, when a stress received by the element isolation region 103 is concentrated at a corner 107 of the element region 102. A primary defect due to an ion implantation is grown to a large defect such as a dislocation by the concentrated stress, and a problem such as an increase of a junction leakage current arises.

Particularly, when an isolation structure in which a high stress feasibly occurs like the case where a groove having a side face normal to the substrate is formed, a damage due to an ion implantation, a stress from a wiring material are combined, as shown in FIGS. 2 and 3, a crystal defect extended to an element region from upper and lower corners of the groove easily occurs.

FIG. 2 is a plan view of a DRAM cell of a conventional structure, and FIG. 3 is a sectional view taken along the line III—III. In FIG. 2, reference numeral 801 denotes a gate wiring (word line); 802, a bit line, 803; a contact between Al gates; 805, a bit line contact; and 806, a capacitor contact. Reference numeral 804 denotes an element region; and 807, a storage note of a lower electrode of the capacitor.

In FIG. 3, a P-type well 812 is provided on a silicon substrate 817, and an isolation region 810 in which an insulator is embedded in a trench is formed in the P-type well 812. A gate oxide film 813 is formed on the P-type well 812 isolated by the isolation region 810, and a gate wiring 801 is formed on the gate oxide film 813 and the isolation region 810. The bit line 802 is formed on the gate wiring 810 through an interlayer insulating film 816, and an Al wiring 809 is disposed further on the bit 802 through the interlayer insulating film 816', a capacitor insulating film 819 and an interlayer insulating film 811. The Al wiring 809 is connected to the gate wiring 801 through the contact 803 between the Al gates.

In the DRAM formed as described above, as apparent in FIG. 3, a crystal defect 814 is extended from the corner of the element isolation region 810 into the P-type well 812.

As described above, when the trench isolating method is intended to be applied to a fine semiconductor element, there is a trend of deteriorating a junction leakage current characteristics of the device due to generation of the crystal defect. Further, the stress is concentrated particularly at the corner of the element region even by the ion implantation, thereby generating the crystal defect, and an increase in the junction leakage current is introduced.

SUMMARY OF THE INVENTION

An object of the present invention is to provide a semiconductor device which can prevent a crystal defect due to such a trench isolation, an impurity implantation.

Another object of the present invention is to provide a method for manufacturing such a semiconductor device.

According to first aspect of the present invention, there is provided a semiconductor device comprising a semiconductor substrate having a groove, and a semiconductor element formed in a surface region of this semiconductor substrate, wherein a substance having a thermal expansion coefficient different from the semiconductor substrate is embedded at least in a part of the groove, a crystal defect is generated in the semiconductor substrate from the groove, thereby a strain of the surface area of the semiconductor substrate is sufficiently alleviated, and a crystal defect is not generated in a region necessary for a circuit operation of the semiconductor element.

Further, according to second aspect of the present invention, there is provided a semiconductor device comprising a semiconductor substrate, and a semiconductor element formed in an element region of the semiconductor substrate, wherein at least one of corners of the element region or at least one of ends of a region of the element underlying a gate electrode thereof region has an impurity concentration lower than a portion except those of the element region.

Moreover, according to a third aspect of the present invention, there is provided, a semiconductor device comprising a semiconductor substrate, a MIS type semiconductor element formed in a surface region of the semiconductor substrate, a first wiring layer for forming or connected to a gate electrode of the MIS type semiconductor element, and a second wiring layer disposed above the first wiring layer, wherein a defect concentrated region exists in the semiconductor substrate under a connecting portion of the first and second wiring layers.

In addition, according to fourth aspect of the present invention, there is provided a semiconductor device comprising a semiconductor substrate having a groove, an element isolation region having an insulating film embedded in the groove of the semiconductor substrate, an element region formed of a plurality of low concentration regions isolated by the element isolation region, semiconductor elements respectively formed on the plurality of low concentration regions, and a high concentration impurity region surrounding a periphery of the element region for attracting metal impurity in the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompaying drawings, which are incorporated in and constitute a part of the specification, illustrate presently preferred embodiments of the invention and, together with the general description given above and the detailed description of the preferred embodiments given below, serve to explain the principles of the invention.

FIGS. 6A to 6H are sectional views showing manufacturing steps of a semiconductor device according to the first embodiment of the present invention;

FIGS. 9A to 9I are sectional views showing manufacturing steps of a semiconductor device according to a fourth embodiment of the present invention;

FIGS. 12 to 16 are plan views showing various disposing examples of a resist pattern to be used for the sixth embodiment of the present invention;

FIG. 24 is a sectional view taken along the line XXIV—XXIV of FIG. 23;

FIGS. 25A and 25B are a plan view and a sectional view showing a main portion of a configuration of a CMOS integrated circuit according to twelfth embodiment of the present invention;

FIGS. 26A to 26E are sectional views showing a manufacturing process of a CMOS integrated circuit according to the twelfth embodiment of the present invention.

DETAILED DESCRIPTION OF THE PREFERRED EMBODIMENTS

Figure 1A:
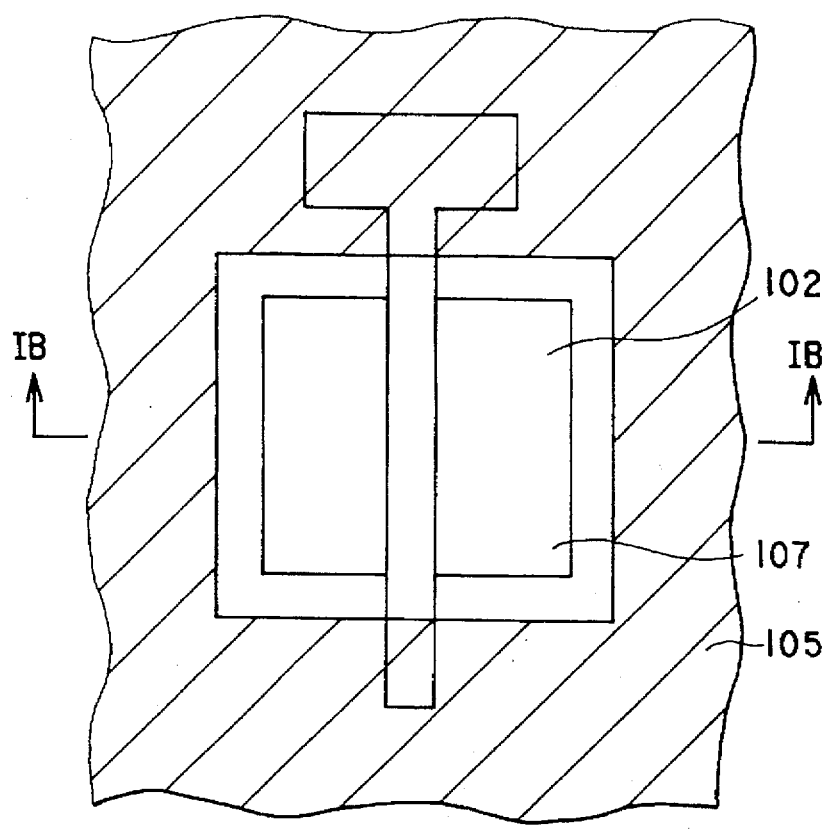
FIGS. 1A and 1B are a plan view and a sectional view showing a disposing example of a conventional resist pattern and a state of an ion implantation.

In a semiconductor device according to a first aspect of the present invention, a groove deeper than a surface region of the semiconductor device is formed in a semiconductor substrate formed with a semiconductor element on the surface region, and a substance having a thermal expansion coefficient different from said semiconductor substrate is embedded in at least a part of the groove. Therefore, a crystal defect is generated from the groove in the semiconductor substrate, thereby sufficiently alleviating a strain of the surface region of the semiconductor substrate, and no crystal defect is generated in a region necessary for a circuit operation of the semiconductor element formed in the surface region.

As a modified example of such a semiconductor device, there is a semiconductor device of a structure as will be described.

(1) A semiconductor layer having a second groove is formed on a semiconductor substrate having a first groove. The first groove is embedded with a first substance, and the second groove is embedded with a second substance. The first substance has a thermal expansion coefficient different from the semiconductor substrate, and the first and second substances are so selected that a difference between the thermal expansion coefficients of the second substance and the semiconductor layer is smaller than a difference between the thermal expansion coefficients of the first substance and the semiconductor substrate.

In such a structure, a crystal defect is generated from the first groove in the semiconductor substrate, thereby sufficiently alleviating a strain of the semiconductor layer, and a crystal defect is not generated in a region necessary for a circuit operation of the semiconductor element formed in the semiconductor layer.

In the semiconductor device of such a structure, the semiconductor elements to be formed can be formed in a structure to be electrically isolated by the second groove and the second substance embedded in the second groove. The semiconductor layer formed on the semiconductor substrate can be epitaxially grown on the semiconductor substrate, and its film thickness is preferably larger than a width of a depletion layer to be formed at a p-n junction of the element.

Such a semiconductor device can be manufactured by the following method.

This method comprises the steps of forming a first groove on a semiconductor substrate, embedding a first substance having a thermal expansion coefficient different from said semiconductor substrate in the first groove, epitaxially growing a semiconductor layer on said semiconductor substrate, forming a second groove in said semiconductor layer, embedding a second substance in the second groove, and forming a semiconductor element in said semiconductor layer.

(2) A plurality of grooves embedded with insulating materials are formed in a semiconductor substrate, a semiconductor element is formed in an element region isolated by the first grooves, and a second groove embedded with an insulating material is formed in a bottom of the first groove.

In such a structure, a crystal defect is generated from the second groove in the semiconductor substrate, thereby sufficiently alleviating a strain of the element region, and a crystal defect is not generated in a region necessary for a circuit operation of the semiconductor element formed in the element region.

In this case, a ratio b/a of a total depth b of the first and second grooves to an interval a between adjacent second grooves is preferably ½ or more.

Reason using the above-described conditions will be simply described. The crystal defect is easily introduced in a certain specific direction. Particularly, in the case of a silicon single crystal, it is known that a crystal defect is easily introduced at an angle θ ($\tan\theta=2^{1/2}$) becoming a direction parallel with (111) plane. Therefore, the above-described conditions are required so as to terminal a crystal defect generated from a bottom of the first groove and not to terminate at an upper portion of the second groove.

A crystal defect generated from the first groove of the semiconductor device is terminated at the bottom of the first groove, the bottom of adjacent first groove or a region deeper than the bottom of the first groove. As a result, a strain of an upper portion of the semiconductor substrate is sufficiently alleviated, and an upper portion of the semiconductor substrate becomes free of a defect.

Impurities of different conductivity type can be introduced into the semiconductor substrate to form two well regions. In this structure, an isolation between wells can be conducted by the first groove or by both the first and second grooves.

The semiconductor device of the structure in the above paragraph (2) is manufactured by the method comprising the steps of forming a second groove in a semiconductor substrate, forming a first groove narrower than the second groove in a bottom of the second groove, embedding the first and second grooves with insulating materials, and forming a semiconductor element in an element region isolated by the second groove.

According to the first aspect of the present invention as described above, in the semiconductor device using a trench isolation method, the crystal defect is previously generated in the semiconductor substrate or in a deep portion of the semiconductor substrate, thereby alleviating a strain of the semiconductor layer or the surface region of the semiconductor substrate, with the result that an element can be formed in a defect free state. Therefore, the semiconductor element formed in the semiconductor layer or the surface area of the semiconductor substrate can be reduced in a junction leakage current due to the crystal defect.

Since the groove having a large aspect ratio which has been heretofore difficult to form can be formed in two stages, an isolation between wells can be relatively simply conducted.

In the semiconductor device according to the second aspect of the present invention, a corner of the element region or an end of the element region to be superposed on a gate electrode has a lower impurity concentration than a portion except the corner or end portion of the element region. More specifically, an impurity implantation is conducted in the state that a resist pattern for implanting an impurity covers a corner of the element region or an end of the element region to be superposed on the gate electrode.

Therefore, no defect occurs due to implantation of the impurity to the corner of the element region or the end of the region to be superposed of the element region with the gate electrode, and even if an impurity is diffused in the corner of the element region from the impurity region, in later heating step, a large defect such as a dislocation due to a stress concentration of the corner of the element region does not occur. As a result, a junction leakage current due to the crystal defect can be reduced.

In the semiconductor device according to the third aspect of the present invention, a defect concentrated region exists in the portion of the semiconductor substrate under a connecting portion of a first wiring layer constituting a gate electrode of a MOS semiconductor element to a second wiring layer disposed above the first wiring layer.

As described above, when the defect concentrated region is arranged in the portion of the semiconductor substrate under a connecting portion between the wirings stereoscopically crossing on an Si substrate, an increase of an area due to the provision of the defect concentrated region is small, and a decrease of an area of the element region does not occur. Because, the portion of the substrate under the connecting portion between the wirings is not originally frequently formed with a device.

As a modified example of such a semiconductor device, there is a semiconductor device of the following structure.

(1) A groove deeper than a well is formed in a portion of a semiconductor substrate under a connecting portion of the first and second wiring layers, and a crystal defect is generated from a bottom of the groove.

In such a structure, a defect concentration region can be formed without increasing an area. Further, since the groove deeper than the element region is formed and the defect is concentrated at its bottom, a distance between the crystal defect and the element can be increased.

(2) A high concentration impurity region is formed in a semiconductor substrate under a connecting portion of the first and second wiring layer, and a crystal defect is generated from a bottom of the impurity layer.

In such a structure, a defect concentrated region can be formed without increasing its area, and a defect in the element region can be reduced.

(3) A groove in which a groove width is abruptly changed and which is deeper than a well having at least one corner (an angular portion) of a plane pattern shape is formed in a portion of a semiconductor substrate under a connecting portion of first and second wiring layers, and a crystal defect is generated from the corner.

In such a structure, a defect concentrated region can be formed without increasing its area, and a defect in the element region can be reduced.

According to the third aspect of the present invention as described above, a defect concentrated layer for gettering (sucking) the crystal defect is arranged apart from the element region, the defect is scarcely generated in the element region, and the defect generated in the element region and a metal contamination are removed. After a large defect such as a dislocation occurs in the defect concentrated layer, a defect free of the element region is maintained even if later steps are executed. Therefore, device characteristics such as junction leakage current characteristics, gate oxide film reliability are remarkably improved. Since the above-described defect concentrated layer is disposed in a region in which a device such as a MOSFET or the like is not normally formed (a region not utilized for a MOSFET due to specific reason), an increase of the area of the device is not introduced. That is, a vacant space can be effectively utilized as a gettering sink.

In the semiconductor device according to the fourth aspect of the present invention, a high concentration impurity region for drawing metal impurity in a semiconductor substrate is provided around a periphery of an element region having a plurality of low concentration regions isolated by element isolation region.

The semiconductor device according to the fourth aspect of the present invention comprises an element region having semiconductor elements each having a low concentration impurity region of $3 \times 10^{15}$ cm$^{-2}$ or less, regularly disposed and electrically isolated by element isolation region obtained by embedding an insulating film in a groove formed in a semiconductor substrate, and a high concentration impurity region provided on an outer periphery of the element region and having $5 \times 10^{15}$ cm$^{-2}$ or more for drawing metal impurity in the element region.

According to the fourth aspect of the present invention as described above, a stress strain due to an insulting film can be alleviated. Therefore, a crystal defect can scarcely occur in the element region, and the metal impurity can be forcibly drawn out of the element region into the defect.

Various embodiments of the present invention will be described with reference to the drawings.

Embodiment 1

Figure 4:
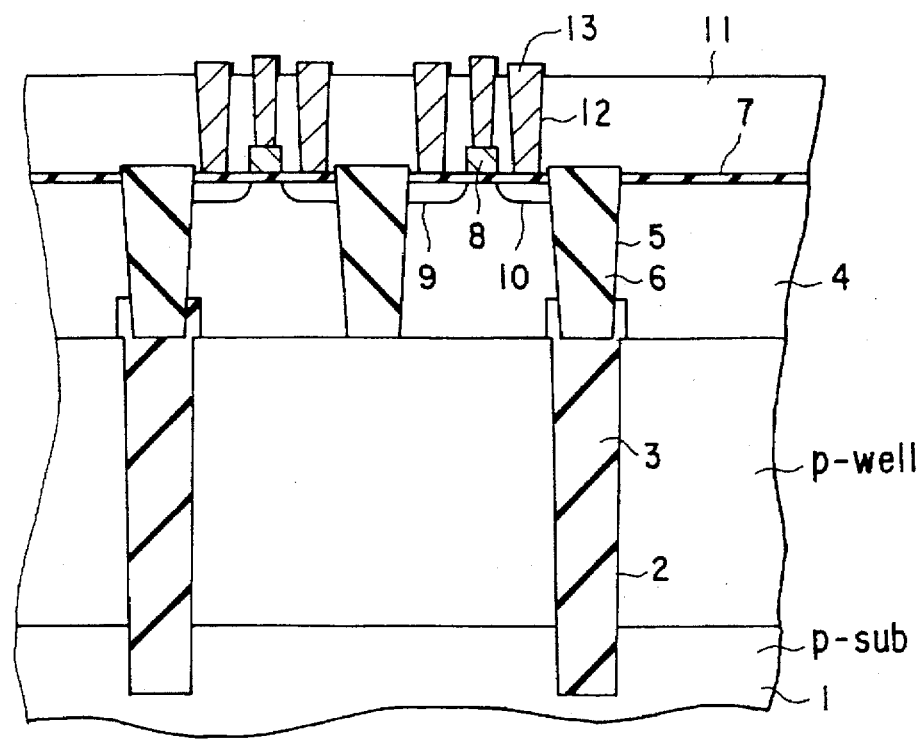
FIG. 4 is a sectional view of a semiconductor device according to a first embodiment of the present invention.

FIG. 4 is a sectional view showing a semiconductor device according to a first embodiment of the present invention. A first groove 2 is formed in a semiconductor substrate 1, and a first embedding material 3 is embedded in the first groove 2. The first embedding material 3 has a thermal expansion coefficient different from the semiconductor substrate, thereby generating a stress at the first groove.

A semiconductor layer 4 is formed on the semiconductor substrate 1. The semiconductor layer 4 constitutes an element forming region, and two element forming regions in the semiconductor layer 4 are electrically isolated by a substance 6 as a second embedding material embedded in a second groove 5. A gate oxide film 7 is formed on the semiconductor layer 4, and a gate electrode 8, a source electrode 9 and a drain electrode 10 are provided. Further, an interlayer insulting film 11 is deposited, a metal wiring layer 13 is formed on the interlayer insulating film 11, and connected to the gate electrode 8, the source electrode 9 and the drain electrode 10 via a contact hole 12.

In the example shown in FIG. 4, an embedding material having a tensile stress may be embedded in the first groove, or an embedding material having a reverse compressive stress may be embedded in the first groove. In either case, a crystal defect is generated from a bottom of the first groove by a large stress. If the crystal defect is once generated, i.e., a dislocation once occurs, the stress in the other region is then alleviated, and a strain is reduced. Therefore, a crystal defect due to the stress is not almost generated in the semiconductor layer 4 formed on the semiconductor substrate having the first groove.

Figure 5:
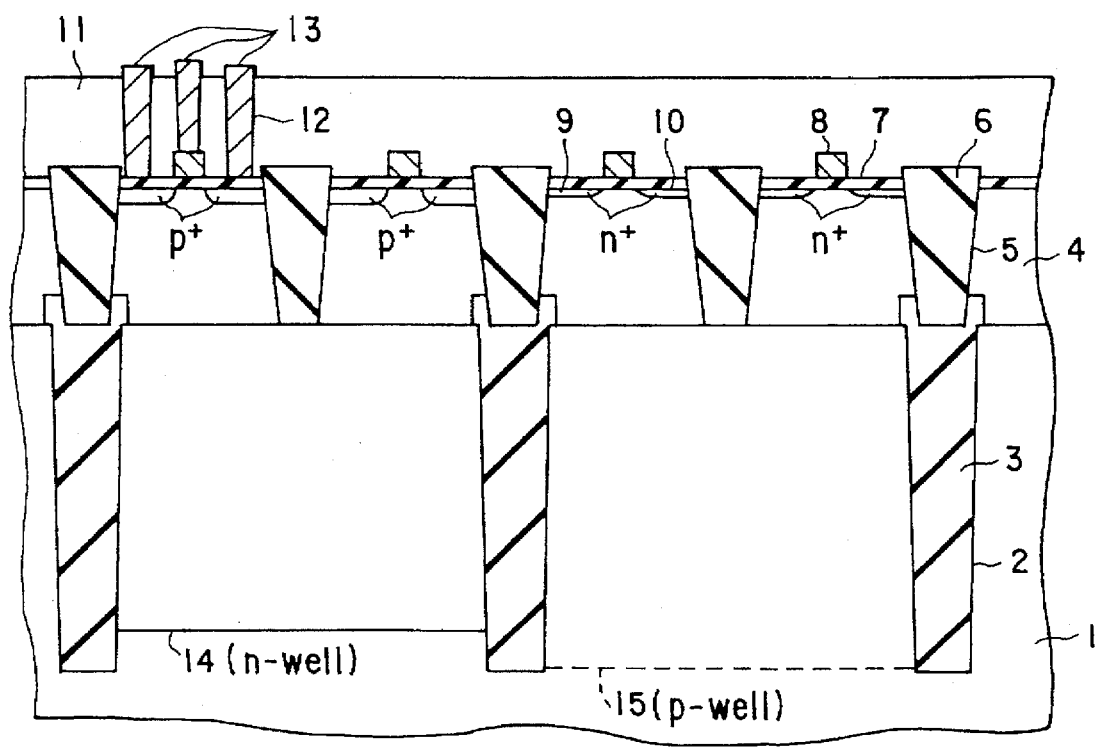
FIG. 5 is a sectional view of a semiconductor device in which the first embodiment of the present invention is applied to a CMOS.

FIG. 5 shows an example of the present invention applied to a CMOS. In this structure, an isolation of an n-type well 14 from a p-type well 15 is conducted with a first groove and a second groove. This structure has an advantage that there is no necessity of forming a groove having a large aspect ratio which has been difficult by present technique. Further, a "retrograde well" can be realized by a conventional apparatus without using a high acceleration energy ion implanting unit.

Figure 1B:
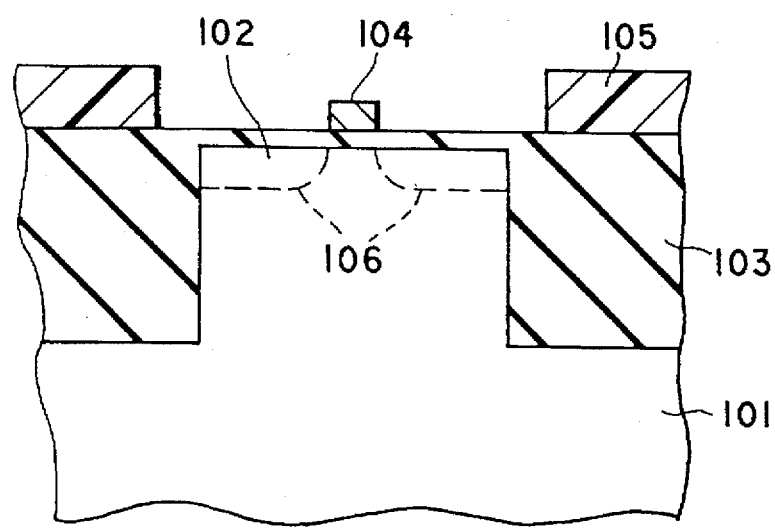
Figure 2:
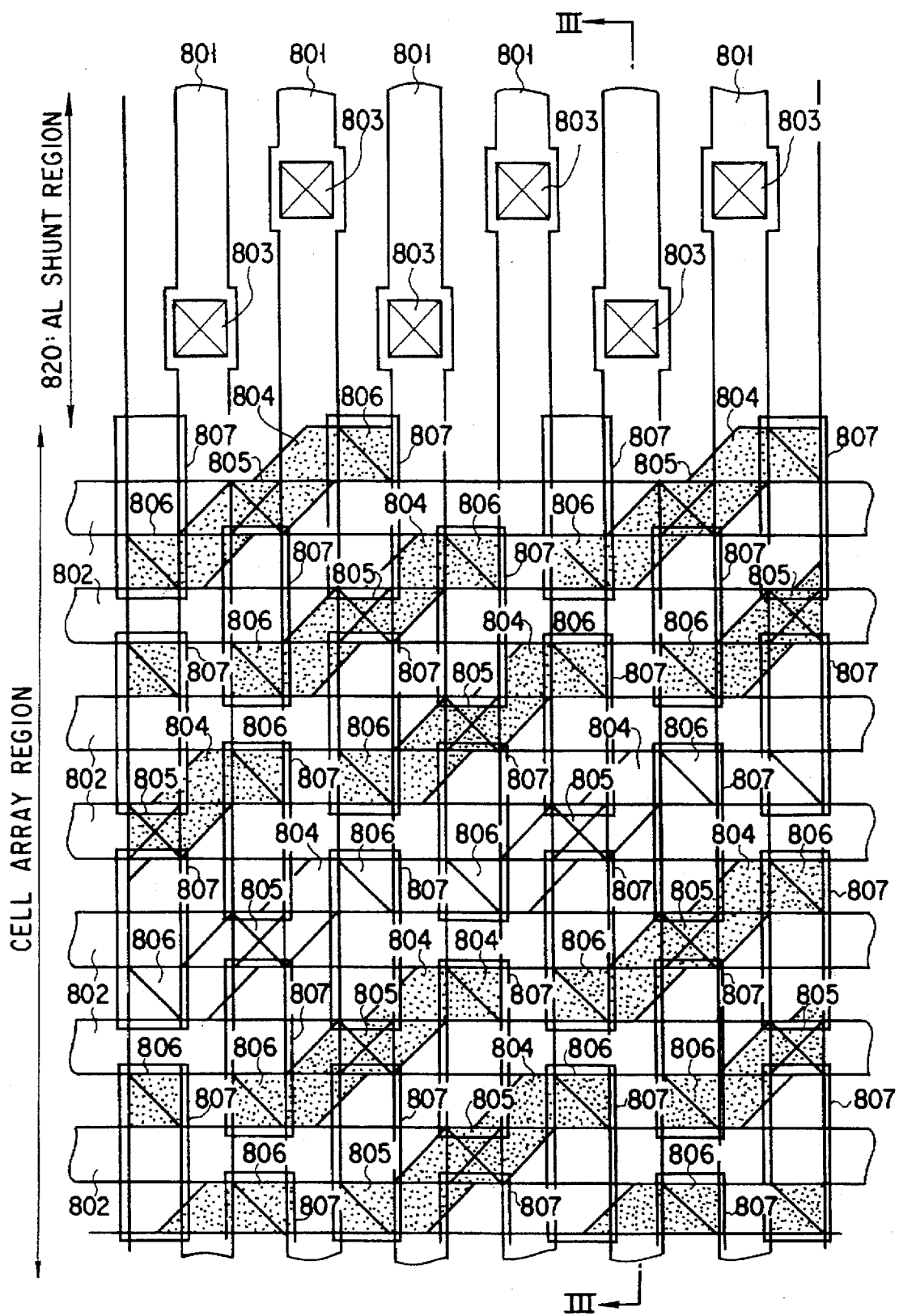
FIG. 2 is a plan view showing a portion of a conventional DRAM cell array.
Figure 3:
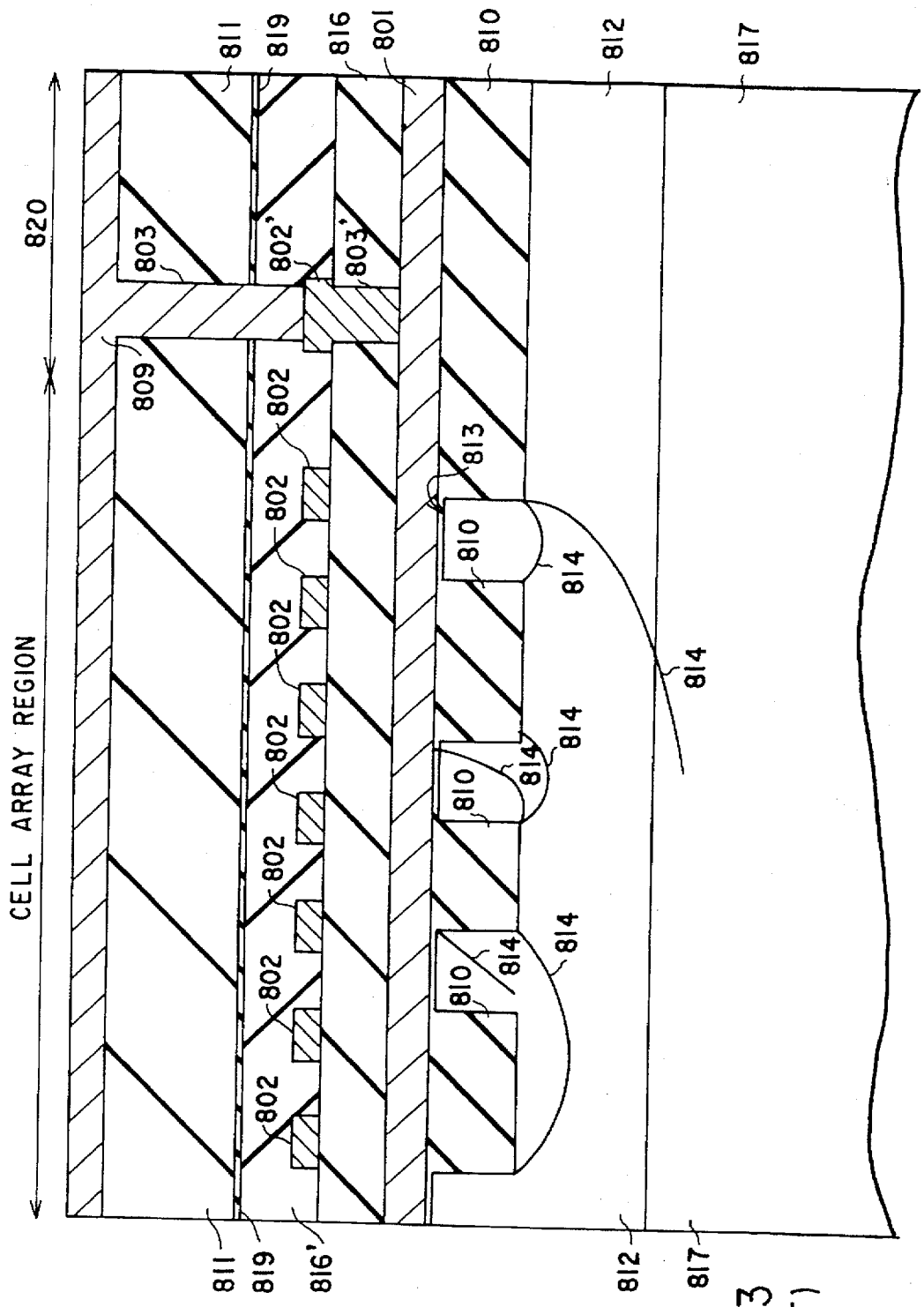
FIG. 3 is a sectional view taken along the line III—III of FIG. 12.

Then, one example of a method for manufacturing a semiconductor device shown in FIG. 1 will be described with reference to FIGS. 6A to 6H.

Figure 6A:
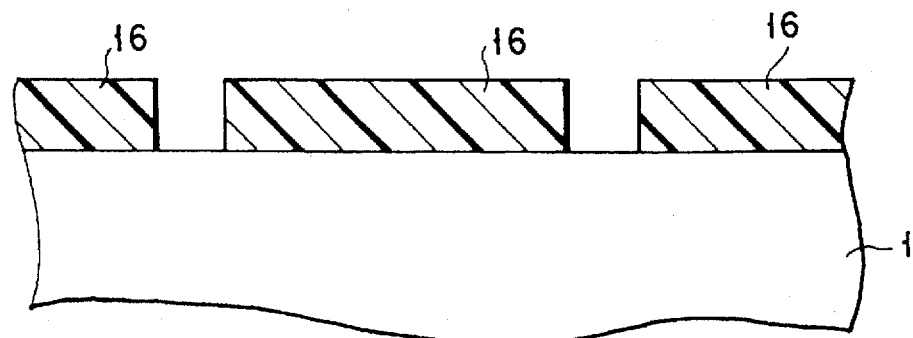
Figure 6B:
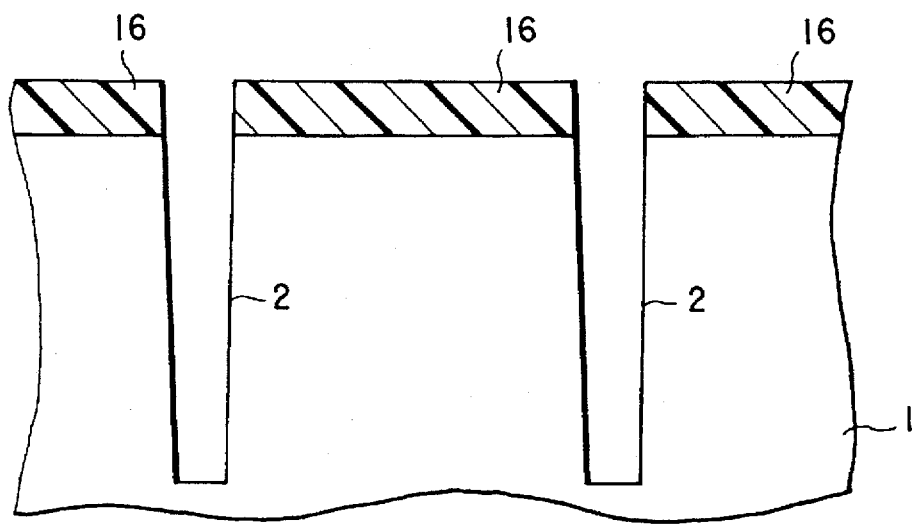

A mask material 16 is deposited on a semiconductor substrate 1, only a first groove forming region is opened, and the other portion is covered with the mask material 16 (FIG. 6A). The mask material 16 used at this time may not always be resist, but a silicon oxide film deposited and patterned may be employed. Then, a silicon substrate is etched by using the mask to form a first groove 2. This etching generally uses an RIE to provide anisotropy (FIG. 6B).

Figure 6C:
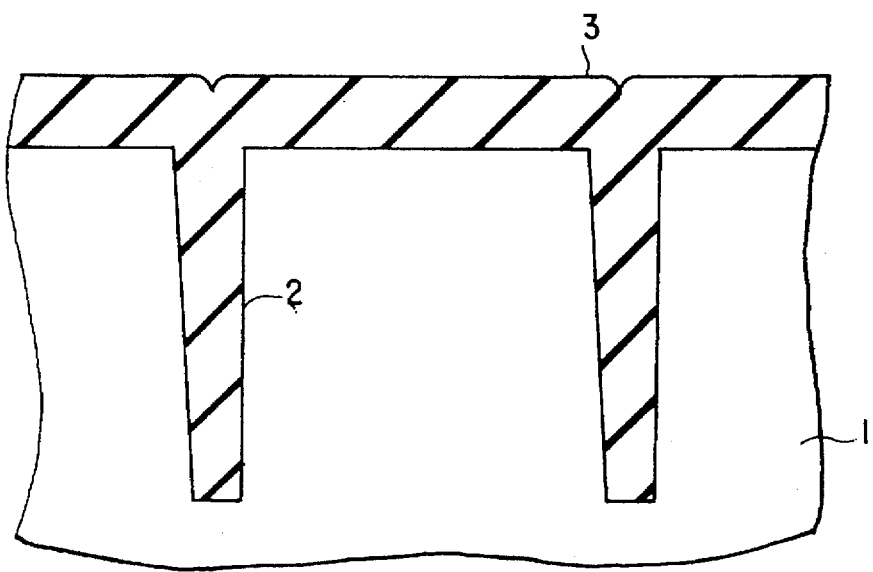

Then, the mask material is removed, and the first embedding material 3 is deposited on the entire substrate (FIG. 6C). At this time, the first embedding material 3 is necessary to have a thermal expansion coefficient different from the semiconductor substrate 1. For example, when the silicon substrate is used, when a silicon nitride film may be deposited by using an LPCVD, the silicon nitride film has largely different thermal expansion coefficient from silicon (a tensile stress of a magnitude of $1 \times 10^{10}$ dyne/cm$^2$ is generated.), and hence it is convenient for the present invention.

Then, the first embedding material 3 is removed except a portion of the groove. This can be realized by masking it by a resist pattern 17 and then using an etching-back step by an RIE (FIG. 6D).

After the resist pattern 17 is removed, a heating is carried out, thereby generating a crystal defect (dislocation) from the bottom of the first groove 2. It is necessary to determined a depth and an interval of the first grooves so that a defect (a dislocation) generated at this time does not arrive at a substrate surface. For example, in the case of a silicon substrate of a plane (100), when a section is taken in parallel with a plane (011), a dislocation is inclined to occur in a direction in parallel with a plane (111), and hence the dislocation occurs in a direction of about 54.74° from a horizontal plane. More specifically, it is necessary that a depth of the groove is larger by at least $\sqrt{2}$ times than an interval of the groove in order that the dislocation may not arrive at a semiconductor substrate surface. Thus, the dislocation is terminated at the side face of the opposed groove, and hence a strain of the substrate is preferably alleviated. When formation of the well is conducted after this heating step, it is convenient for isolation. In this case, boron is ion implanted to form a p-type well (FIG. 6E).

Then, the semiconductor layer 4 is formed on the semiconductor substrate 1. At this time, the semiconductor layer 4 must be formed while holding crystallinity under the conditions of epitaxially growing on a base substrate since the semiconductor element is formed in the semiconductor layer (FIG. 6F)

More particularly, the semiconductor layer is formed by a silicon molecular beam epitaxy method or an organometallic molecular CVD (MOCVD). A thickness of the semiconductor layer 4 is limited to such a thickness that a stress generated from the second groove 5 to be used for element isolation is sufficiently reduced. However, the thickness must be larger than a width of the depletion layer formed at the p-n junction of the element. The reason is because, when the depletion layer is crossed by the crystal defect, it might become a cause of generating a junction leakage current. If the defect can be retained only in the bottom of the semiconductor substrate, the thickness of the semiconductor layer is reduced as much as possible, and a dose to the semiconductor layer is suppressed to improve performance of the element.

More specifically, a current driving power of a semiconductor element represented by a MISFET can be increased, and a punchthrough contributing to a short-channel effect is suppressed by impurity doping into the substrate. It is predicted that a portion of the semiconductor layer above the first groove has wrong crystallinity, but if a second groove is formed in that portion of the semiconductor layer, there is no problem. If necessary, an impurity is implanted in the semiconductor layer, thereby forming a desired well.

Figure 6G:
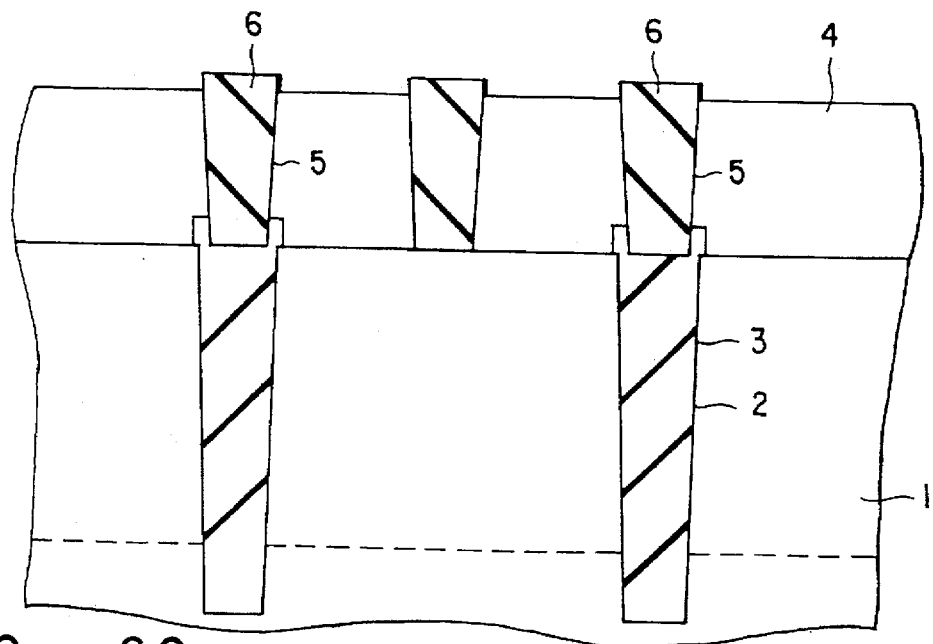

Then, a second groove 5 is formed as an element isolation region in the semiconductor layer. This second groove 5 is formed by providing a mask having a pattern for an element isolation region similarly to the first groove 2 on the semiconductor layer 4, and processing it using the mask by an RIE or the like. In this case, there is no problem even if the second groove 5 is superposed on the first groove 2. Further, when the second embedding material 6 is deposited thereon, and an element isolation region is formed by an RIE etching-back method (FIG. 6G).

The embedding material 6 of this case is required for a thermal expansion coefficient not largely different from that of the semiconductor layer unlike the material 3 embedded in the first groove 2. For example, a material such as silicon oxide and polysilicon are used. When the silicon oxide film is used, a depositing temperature is important. When it is deposited at about 650° to 750° C., it is known that only a low compressive stress of 0 to $1 \times 10^9$ dyne/cm$^2$ is generated. Further, it is known that a tensile stress of about 1 to $4 \times 10^9$ dyne/cm$^2$ is generated at a low temperature of 400° to 500° C. In either case, the silicon oxide film generates a stress smaller than the silicon nitride film. Thus, the material 6 embedded in the second groove 5 can make the semiconductor layer defect free.

Figure 6H:
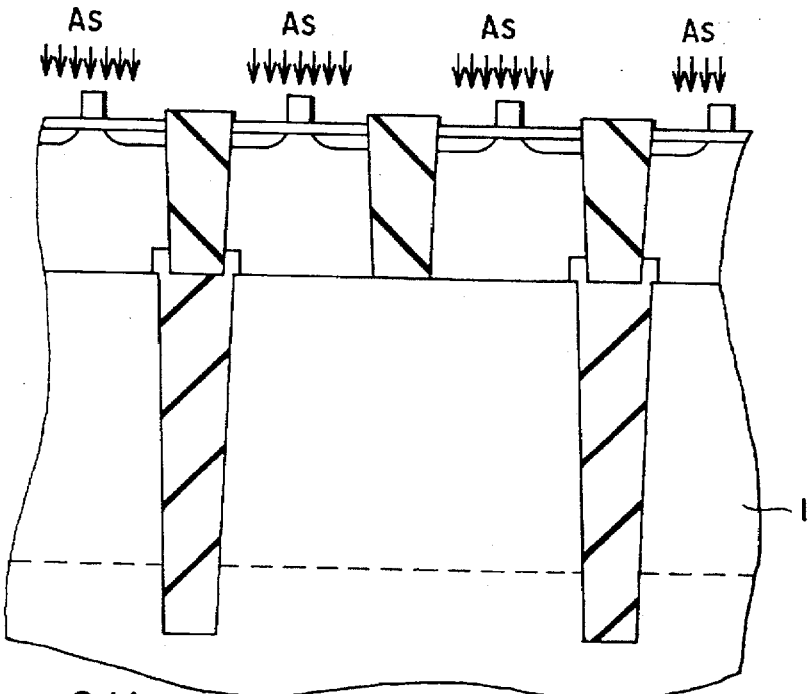

The following steps are conducted according to ordinary manufacturing steps of a semiconductor element. For example, in the case of manufacturing a MISFET, after a gate insulated film (silicon oxide film) 7 is formed, a gate electrode material such as, for example, polysilicon is deposited. Then, the polysilicon film is patterned to form a gate electrode using an RIE or the like. Then, an impurity is ion implanted into the semiconductor layer 4 to form a source region 9 and a drain region 10 (FIG. 6H). In this case, arsenic is used as an impurity. Of course, the gate electrode 8 may be processed after an impurity is previously doped.

An interlayer insulating film 11 is eventually deposited, a contact hole 12 is opened, and a metal wiring 13 is formed, thereby completing a semiconductor device shown in FIG. 4.

A CMOS as shown in FIG. 5 can be similarly manufactured. That is, if implantation of the impurities into one region is performed while masking another region in the case of forming the wells, the CMOS device can be manufactured by the similar steps.

Embodiment 2

Figure 7A:
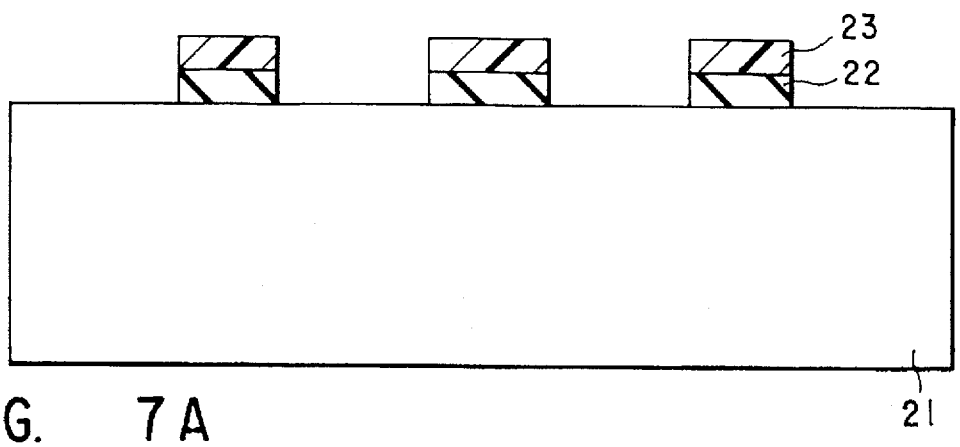
FIGS. 7A to 7I are sectional views showing manufacturing steps of a semiconductor device according to a second embodiment of the present invention.

FIGS. 7A to 7I are sectional views showing manufacturing steps of a semiconductor device according to a second embodiment of the present invention. First, after a thermal oxide film 22 of a thickness of 200 nm is formed on a surface of a p-type silicon substrate 21, a resist pattern 23 is formed on an element forming region, and with the resist pattern 23 used as a mask, the thermal oxide film 22 is etched by an RIE method (FIG. 7A).

Then, the resist pattern 23 is removed, and with the thermal oxide film 22 used as a mask, the silicon substrate 21 is etched in a depth of, for example, 1 μm by an RIE method to form a first groove. Thus, a protruding insular portion is formed. Then, after a first silicon oxide film 24 is deposited on an entire surface in a thickness of about 100 nm by a CVD method, the entire surface is etched by the RIE.

Figure 7B:
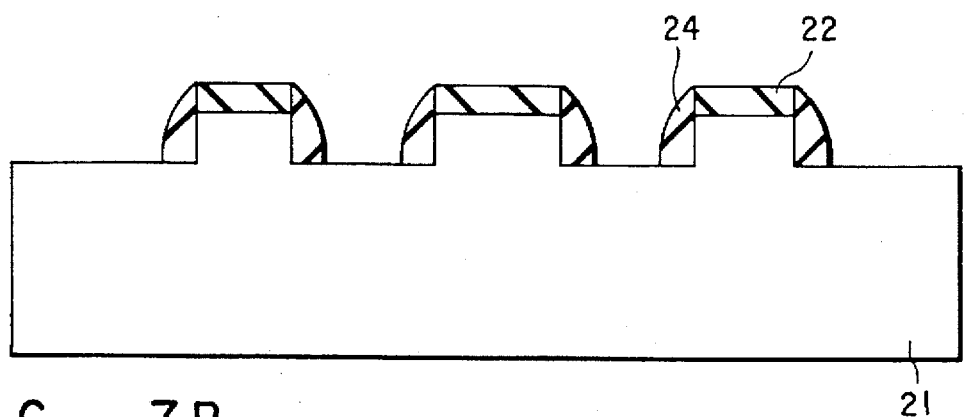

At this time, the first silicon oxide film 24 remains on a sidewall of the first groove (FIG. 7B).

Figure 7C:
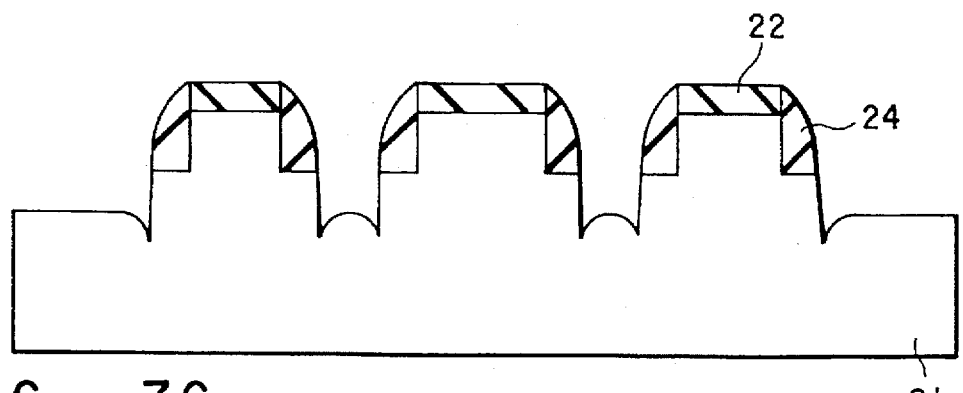

Further, with the thermal oxide film 22 and the silicon oxide film 24 of the sidewall used as masks, the silicon substrate 21 is etched in a depth of 1 μm under the conditions of power of 300 W or less and pressure of 75 mTorr by an RIE method using only HBr gas, thereby forming a second groove. The second groove is dug at a base of the sidewall at a sharp angle (FIG. 7C). With such a shape, a crystal defect is feasibly generated from the portion.

Figure 7D:
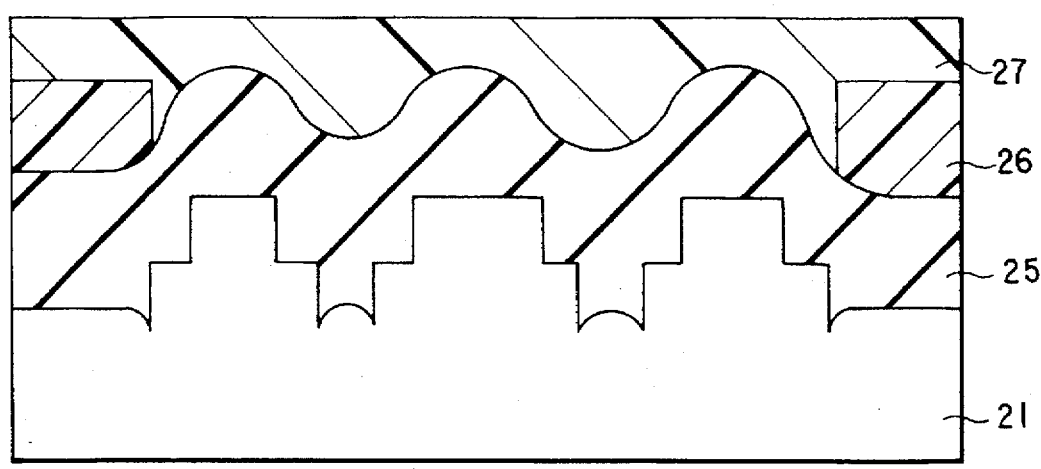

Subsequently, the thermal oxide film 22 and the first silicon oxide film 24 are removed by fluoric acid series aqueous solution such as $NH_4F$ aqueous solution. Then, the second silicon oxide film 25 is deposited in a thickness of 2.4 μm by a CVD method. Further, a second resist pattern 26 of a thickness of 2.0 μm is formed on a wide element isolation region, then coated with third resist 27 having low viscosity, thereby flattening an uneven portion of the surface. (FIG. 7D).

Figure 7E:
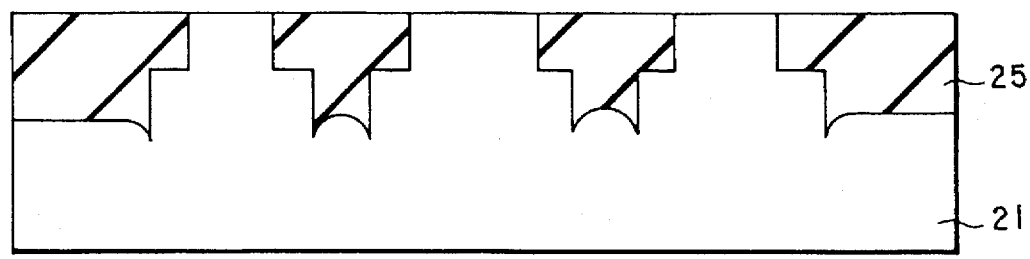

Then, the second and third resists 26, 27 and the second silicon oxide film 25 are etched back under the conditions that etching rates of the second and third resists 26, 27 and the second silicon oxide film 25 become equal by an RIE. At this time, the silicon oxide film 25 of 50 nm is retained on the insular portion. Thereafter, it is etched by 50 nm with $NH_4F$ aqueous solution (FIG. 7E).

Figure 7F:
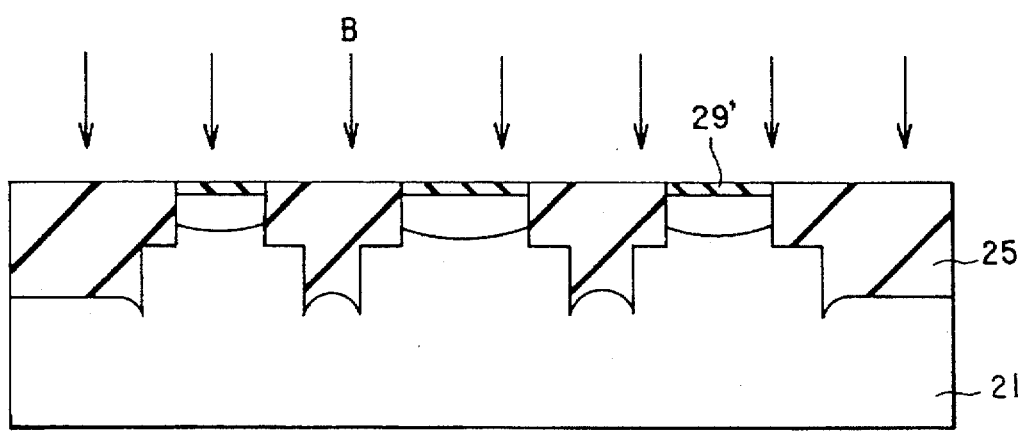

Subsequently, after a dummy oxide film 29' of a thickness of 29 nm is formed, boron ions are implanted in the entire silicon substrate 21 by an accelerating voltage of 50 keV and a dose of $6 \times 10^{12}$ $cm^{-2}$, thereby forming a p-type well region 28 (FIG. 7F). Thereafter, it is heat treated at 1000° C. for 20 sec. in a nitrogen atmosphere by using a rapid thermal annealing method (RTA), thereby activating boron ions. The dummy oxide film 29' is removed with the $NH_4F$ aqueous solution, and a gate oxide film 29 of a thickness of 10 nm is newly formed.

Figure 7G:
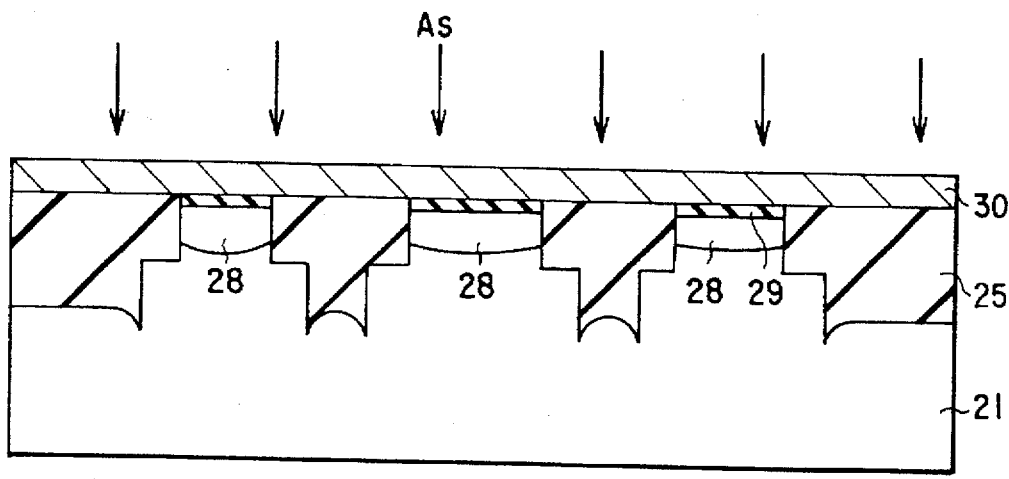
Figure 7H:
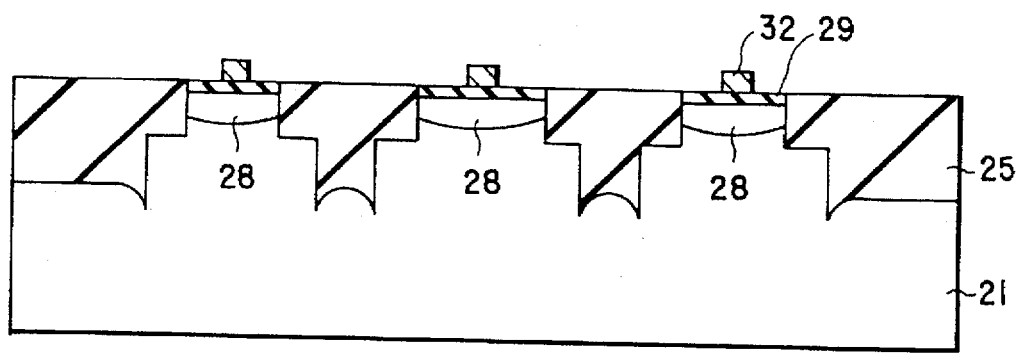

Then, a polycrystalline silicon film 30 of a thickness of 200 nm is deposited on an entire surface, and then arsenic ions are implanted in a polycrystalline silicon film 30 at an accelerating voltage of 30 Key and a dose of $5 \times 10^{15}$ $cm^{-2}$. Thereafter, it is heat treated at 1,000° C. for 20 sec. in a nitrogen atmosphere by using the RTA, thereby activating the arsenic ions (FIG. 7G). Then, with the resist pattern (not shown) used as a mask, the polycrystalline silicon film 30 is etched by the RIE, and a gate electrode 32 is formed (FIG. 7H).

Figure 7I:
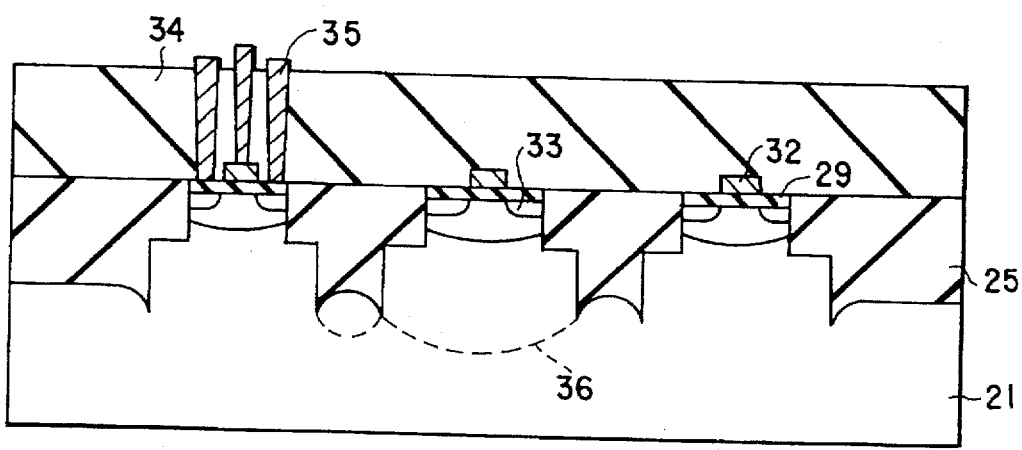

Thereafter, N-type impurity is ion implanted according to manufacturing steps of an ordinary N-type MOSFET using the gate electrode 32 as a mask, thereby forming a diffused region 33. Further, a CVD oxide film 34 passivating step, a contact hole opening step and an A1 wiring 35 forming step are conducted, thereby completing an N-type MOSFET (FIG. 7I).

According to the embodiment described above, the crystal defect is generated from the bottom of the second groove, the generated crystal defect 36 is terminated at the bottom of the second groove or the bottom of the adjacent second groove, not extended to the element region, but the element is resultantly defect-free state. In the embodiment described above, the N-type MOSFET is used as the example. However, this embodiment can also be applied similarly to a CMOS, a P-type MOSFET.

Embodiment 3

Figure 8A:
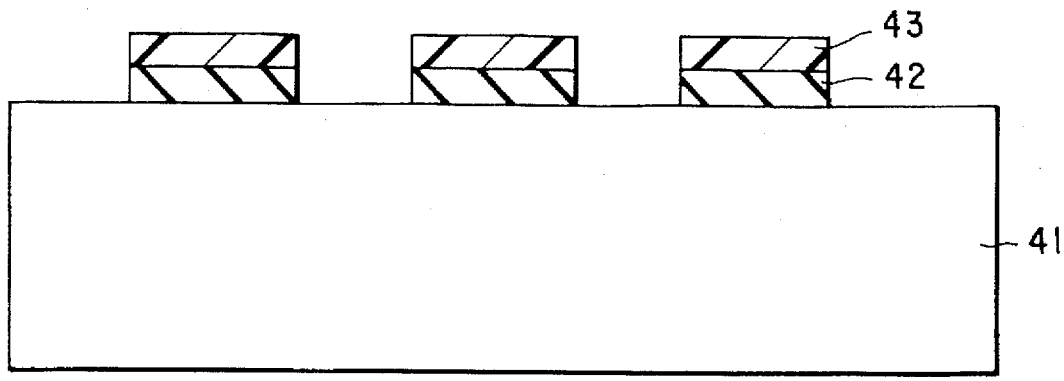
FIGS. 8A to 8I are sectional views showing manufacturing steps of a semiconductor device according to a third embodiment of the present invention.

FIGS. 8A to 8I are sectional views showing manufacturing steps of an N-type MOSFET according to a third embodiment of the present invention. First, after a thermal oxide film 42 of a thickness of 200 nm is formed on a surface of a p-type silicon substrate 41, a resist pattern 43 is formed on an element forming region, and with the resist pattern 43 used as a mask, the thermal oxide film 42 is etched by an IRE method (FIG. 8A).

Figure 8B:
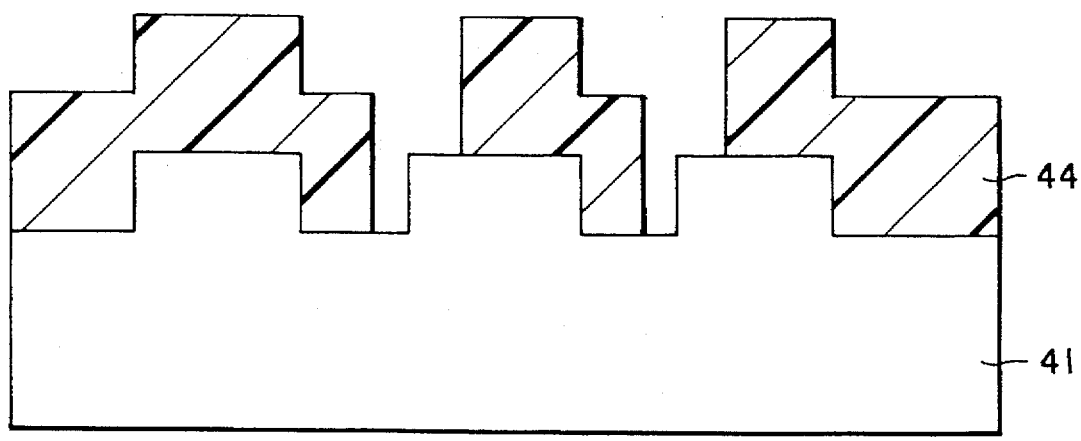
Figure 8C:
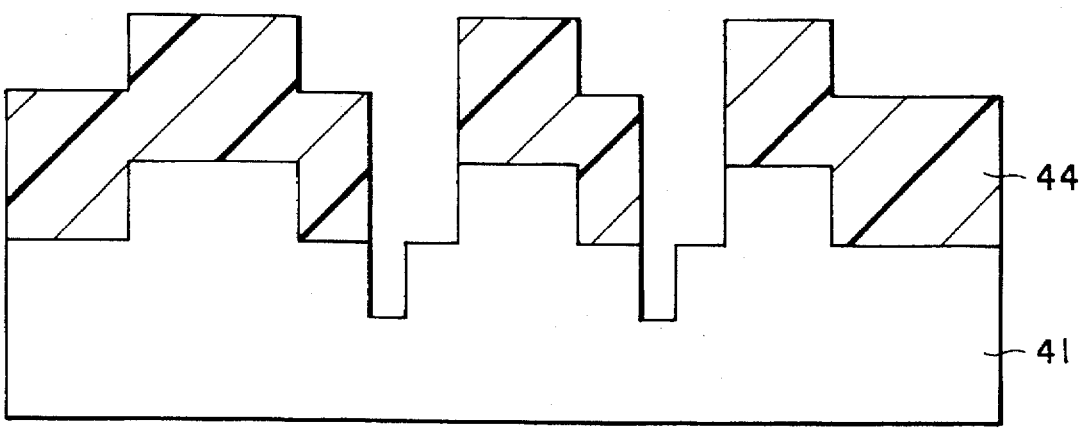

Then, the resist pattern 43 is removed, with the thermal oxide film 42 used as a mask, the silicon substrate 41 is etched in a depth of 1 μm by an IRE method, thereby forming a first groove. Thus, a protruding insular portion is formed. Then, after the thermal oxide film 42 is removed with $NH_4F$ aqueous solution, the second resist pattern 44 is formed at a position deviating from that of the resist pattern 43 (FIG. 8B). Then, with the second resist pattern 44 used as a mask, the silicon substrate 41 is etched in a depth of 1 μm by an IRE method, thereby forming a second groove (FIG. 8C). Such a groove of a narrow width and a deep depth is formed, and hence a crystal defect is easily generated from the bottom of the groove.

Figure 8D:
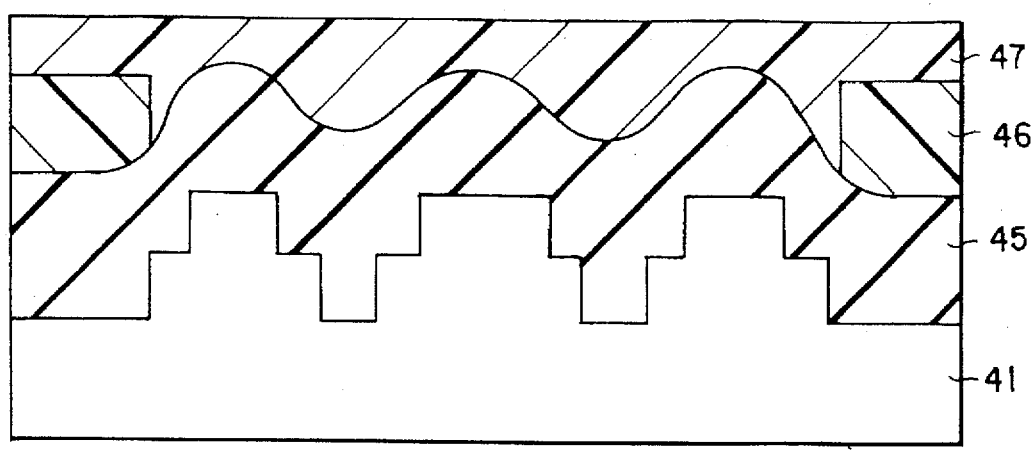
Figure 8E:
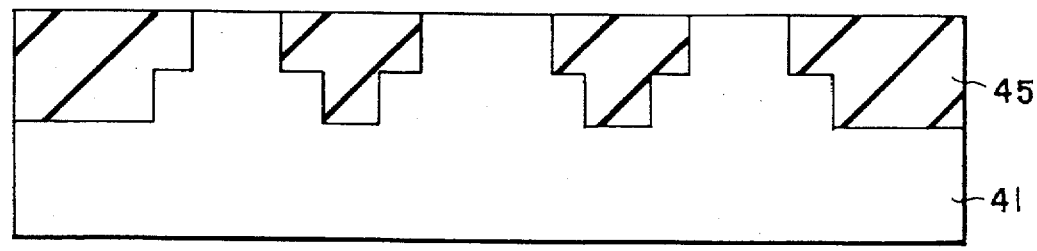

Then, after the second resist pattern 44 is removed, a silicon oxide film 45 of a thickness of 2.4 μm is deposited by a CVD method. A third resist pattern 46 of a thickness of 2 μm is formed on a wide element isolation region of the silicon oxide film 45, then coated with a fourth resist 47 having low viscosity, thereby flattening an uneven portion of the surface (FIG. 8D).

Subsequently, the third and fourth resists 46, 47 and a silicon oxide film 45 are etched back under the conditions that etching rates of the third and fourth resists 46, 47 and the silicon oxide film 45 become equal by an RIE. At this time, a silicon oxide film 45 of 50 nm is retained on the insular portion. Thereafter, the entire surface is etched by 50 nm with $NH_4F$ aqueous solution FIG. 8E).

Figure 8F:
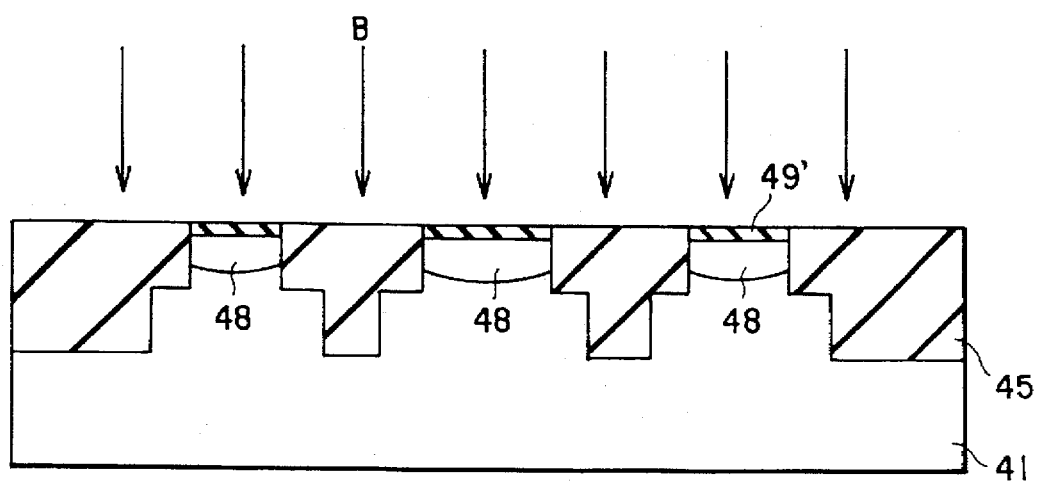

Then, after a dummy oxide film 49' of a thickness of 10 nm is formed, boron ions are implanted in the silicon substrate 41 at an accelerating voltage of 60 keV and dose of $6 \times 10^{12}$ $cm^{-2}$, thereby forming a p-type well region 48 (FIG. 8F). Thereafter, it is heat treated at 1,000° C. for 20 sec. in a nitrogen atmosphere by using a rapid thermal annealing method (RTA), thereby activating boron ions. The dummy oxide film 49' is removed with $NH_4F$ aqueous solution, and a gate oxide film 49 of a thickness of 10 nm is newly formed.

Figure 8G:
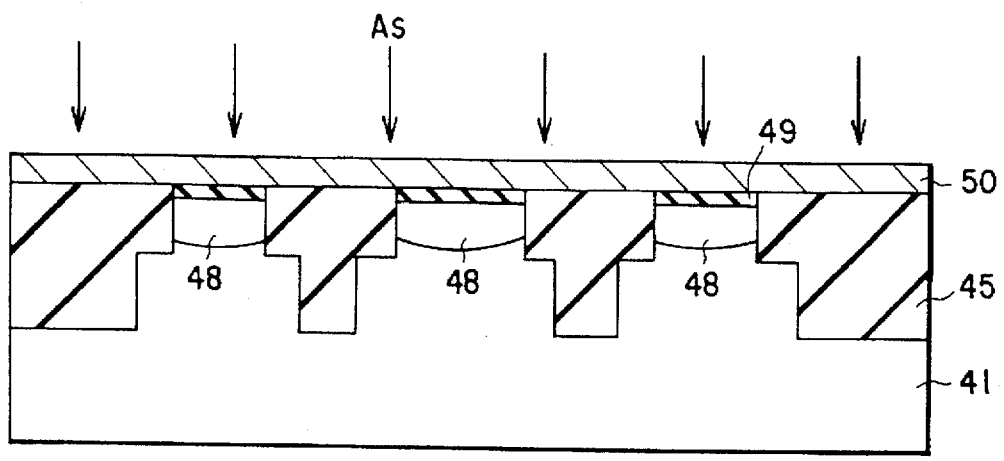
Figure 8H:
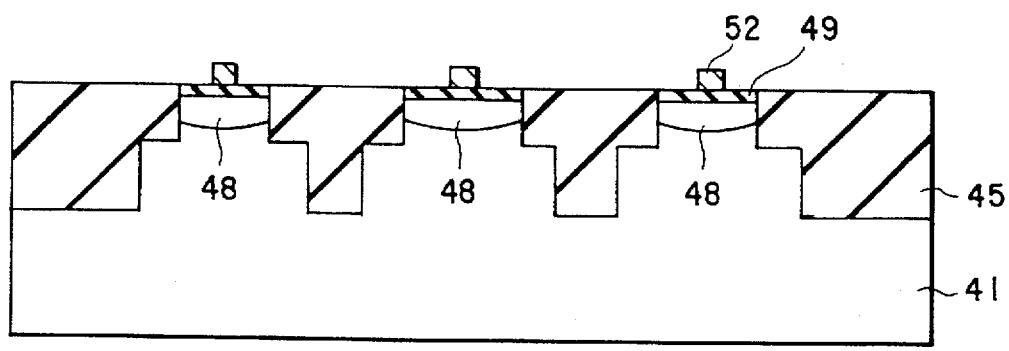

Then, a polycrystalline silicon film 50 of a thickness of 200 nm is deposited on the entire surface, and then arsenic ions are implanted in the polycrystalline silicon film 30 at an accelerating voltage of 30 keV and dose of $5 \times 10^{15}$ $cm^{-2}$. Thereafter, it is heat treated at 1,000° C. for 20 sec. in a nitrogen atmosphere by using the RTA, thereby activating the arsenic ions (FIG. 8G). Then, with the resist pattern (not shown) used as a mask, the polycrystalline silicon film 50 is etched by an RIE, thereby forming a gate electrode 52 (FIG. 8H).

Figure 8I:
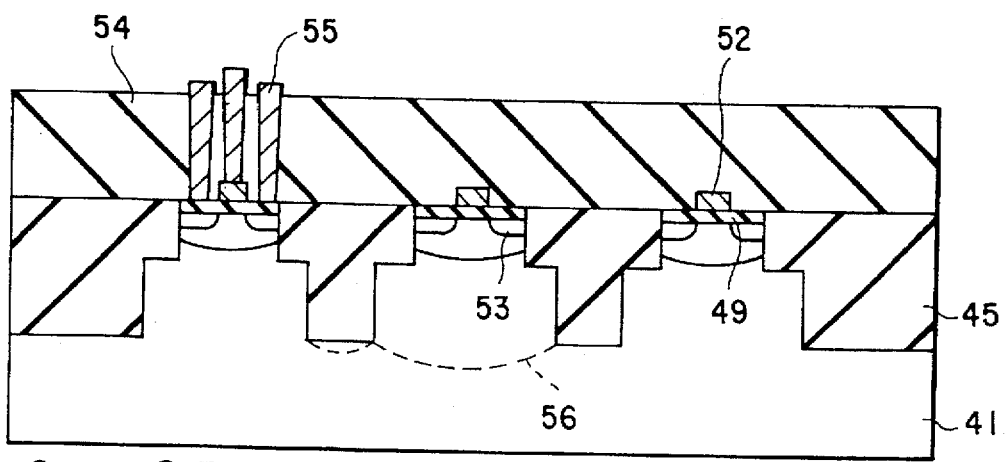

Thereafter, with the gate oxide film 52 used as a mask, N-type impurity is ion implanted according to manufacturing steps of an ordinary N-type MOSFET, a diffused region 53 is formed, and further a CVD oxide film 54 passivating step, a contact hole opening step and an A1 wiring 55 forming step are conducted, thereby completing an N-type MOSFET (FIG. 8I).

According to the embodiment described above, the crystal defect is generated from the bottom of the second groove, the generated crystal defect 56 is terminated at the bottom of the second groove or the bottom of the adjacent second groove, not extended to the element region, but the element region is resultantly defect-free state. In the embodiment described above, the N-type MOSFET is used as the example. However, the embodiment can be similarly applied to a CMOS, a P-type MOSFET.

Embodiment 4

Figure 9A:
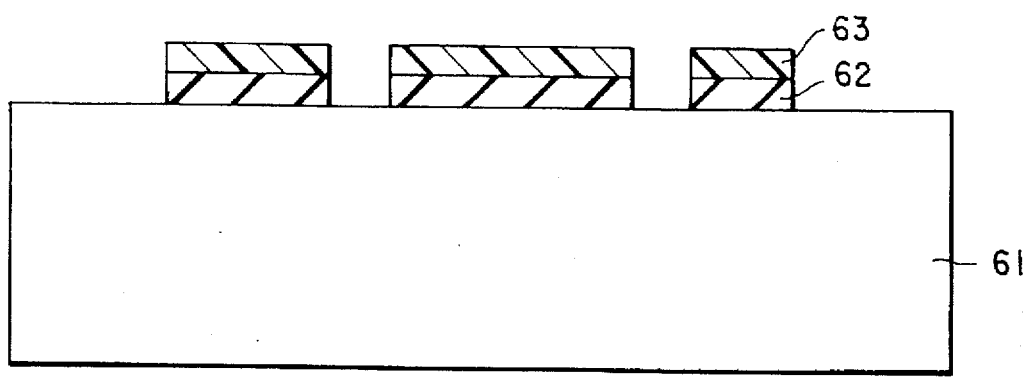

FIGS. 9A to 9I are sectional views showing manufacturing steps of an N-type MOSFET according to a fourth embodiment of the present invention. First, a first thermal oxide film 62 of a thickness of 200 nm is formed on a surface of a p-type silicon substrate 61, then a resist pattern 63 is formed on an element forming region, and with the resist pattern 63 used as a mask, the first thermal oxide film 62 is etched by an RIE method (FIG. 9A).

Figure 9B:
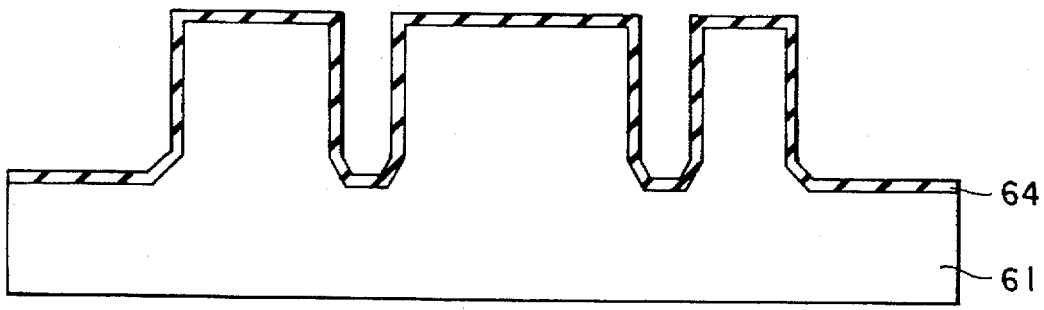

Then, the resist pattern 63 is removed, and with the first thermal oxide film 62 used as a mask, the silicon substrate 61 is etched in a depth of 2 µm by an RIE method to form a groove. Thus, a protruding insular portion is formed. Then, after the thermal oxide film 62 is removed with $NH_4F$ aqueous solution, and a second thermal oxide film 64 is formed on the entire surface of the substrate 61 by using oxidizing conditions to permit a facet to be present in the bottom of the groove (FIG. 9B). Incidentally, when the facet appears at the bottom of the groove, a crystal defect is easily generated from the facet.

Then, the polysilicon film 65 of a thickness of 2.4 µm is deposited by a CVD method, and etched back by using a CDE method. At this time, after the silicon oxide film 65 is deposited, it is flattened with the resist, and may be etched back under the condition that etching rates of the polysilicon film and the resist become equal by RIE.

Figure 9C:
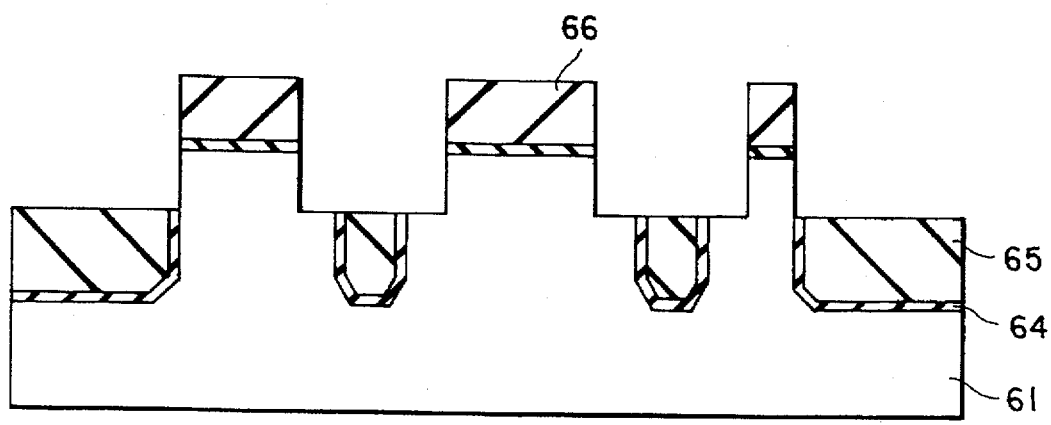

Thereafter, the second resist pattern 66 is formed, and with the second resist pattern 66 used as a mask, it is etched in a depth of 1 µm under the condition that etching rates of the silicon substance 61 and the first polycrystalline silicon 65 become equal (FIG. 9C). Then, the second resist pattern 66 is removed.

Thereafter, the silicon oxide film 67 is deposited in a thickness of 1.4 µm by a CVD method. Further, a third resist pattern 68 of a thickness of 1.4 µm is formed on a wide element isolation region, and the coated with a fourth resist 69 having low viscosity, thereby flattening an uneven surface (FIG. 9D).

Subsequently, the third and fourth resists 68, 69 and a silicon oxide film 67 are etched back under the condition that etching rates of the third and fourth resists 68, 69 and the silicon oxide film 67 become equal by an IRE. At this time, the silicon oxide film 67 of 50 nm is retained on the insular portion. Thereafter, it is etched by 50 nm with $NH_4F$ aqueous solution (FIG. 9E).

Subsequently, after a dummy oxide film 71' of a thickness of 10 nm is formed, boron ions are implanted in the entire silicon substrate 61 at an accelerating voltage of 60 key and dose of $6 \times 10^{12}$ $cm^{-2}$, thereby forming a p-type well 70. Thereafter, it is heat treated at 1,000° C. for 20 sec in a nitrogen atmosphere by using a rapid thermal annealing method (RTA), thereby activating the boron ions. The dummy oxide film 71' is removed with $NH_4F$ aqueous solution, and a gate oxide film 71 of a thickness of 10 nm is newly formed (FIG. 9F).

Figure 9G:
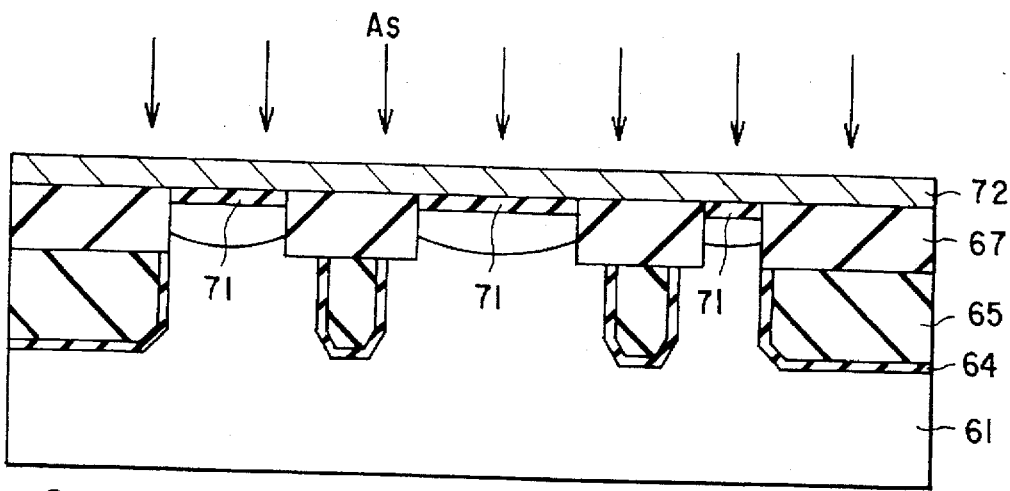
Figure 9H:
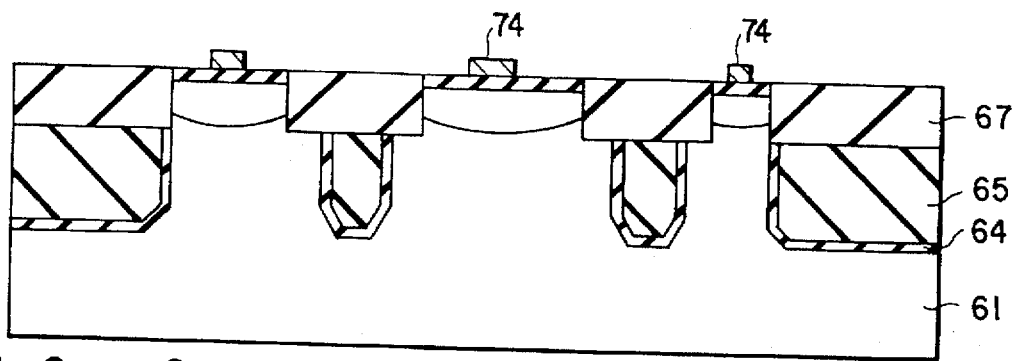

Then, a second polycrystalline silicon film 72 of a thickness of 200 nm is deposited on the entire surface, and then arsenic ions are implanted in the polycrystalline silicon film 72 at an accelerating voltage of 30 keV and dose of $5 \times 10^{15}$ $cm^{-2}$. Then, it is heat treated at 1,000° for 20 sec. in a nitrogen atmosphere by using an RTA, thereby activating the arsenic ions (FIG. 9G). Subsequently, with the resist pattern (not shown) used as a mask, the polycrystalline silicon film 72 is etched by an RIE, thereby forming a gate electrode 74 (FIG. 9H).

Figure 9I:
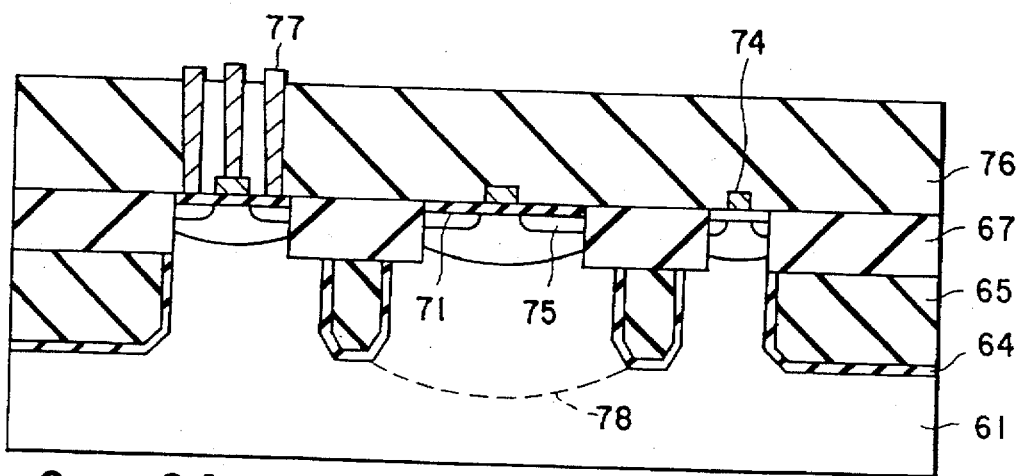

Thereafter, according to manufacturing steps of ordinary N-type MOSFET, with the gate oxide film 74 used as a mask, N-type impurity ions are implanted, a diffused region 75 is formed, and further a passivating step for CVD oxide film 76, a contact hole opening step and an Al wiring 77 forming step are executed, thereby completing an N-type MOSFET (FIG. 9I).

According to the embodiment described above, the crystal defect is generated from the bottom of the second groove, the generated crystal defect 78 is terminated at the bottom of the second groove or the bottom of the adjacent second groove, not extended to the element region, but the element region is in a crystal defect free state. In the embodiment described above, the N-type MOSFET is used as the example. However, this embodiment may be similarly applied to a CMOS, a P-type MOSFET.

Embodiment 5

Figure 10A:
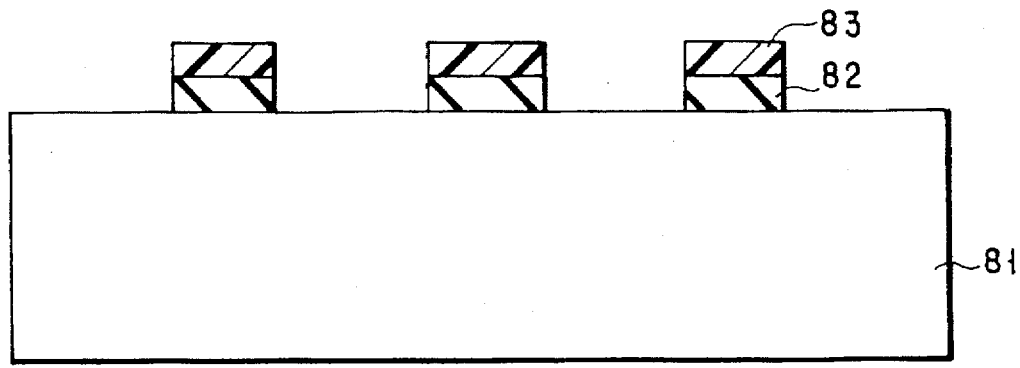
FIGS. 10 to 10I are sectional views showing manufacturing steps of a semiconductor device according to a fifth embodiment of the present invention.

FIGS. 10A to 10I are sectional views showing manufacturing steps of a semiconductor device according to a fifth embodiment of the present invention. First, after a thermal oxide film 82 of a thickness of 200 nm is formed on the surface of a p-type silicon substrate 81, a resist pattern 83 is formed on an element forming region, and with the resist pattern 83 used as a mask, the thermal oxide film 82 is etched by an RIE method (FIG. 10A).

Figure 10B:
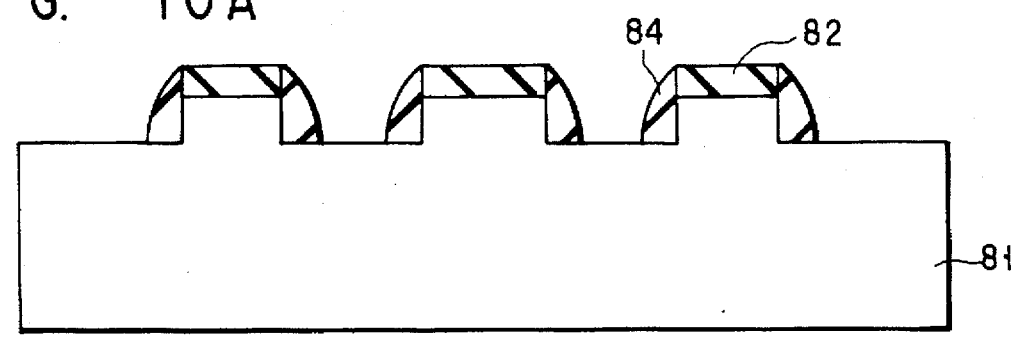

Thereafter, the resist pattern 83 is removed, and with the thermal oxide film 82 used as a mask, the silicon substrate 81 is etched in a depth of 1 µm by an RIE method, thereby forming a first groove. Thus, a protruding insular portion is formed. Then, a first silicon oxide film 84 of a thickness of 100 nm is deposited on the entire surface by a CVD method, and then the entire surface is etched by an RIE. At this time, the first silicon oxide film 84 is retained on a sidewall of the first groove (FIG. 10B).

Figure 10C:
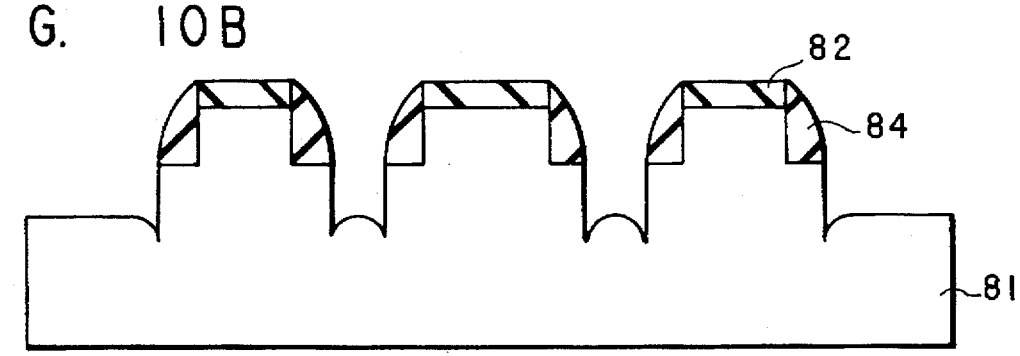

Further, with the thermal oxide film 82 and the silicon oxide film 84 of the sidewall used as masks, the silicon substrate 81 is etched in a depth of 1 µm by an RIE method using only HBr gas under the conditions of power of 300 W or less and a pressure of 75 mTorr, thereby forming a second groove. The second groove is dug at a base of the sidewall in a sharp angle state (FIG. 10C). With such a shape, the crystal defect is easily generated from the portion.

Figure 10D:
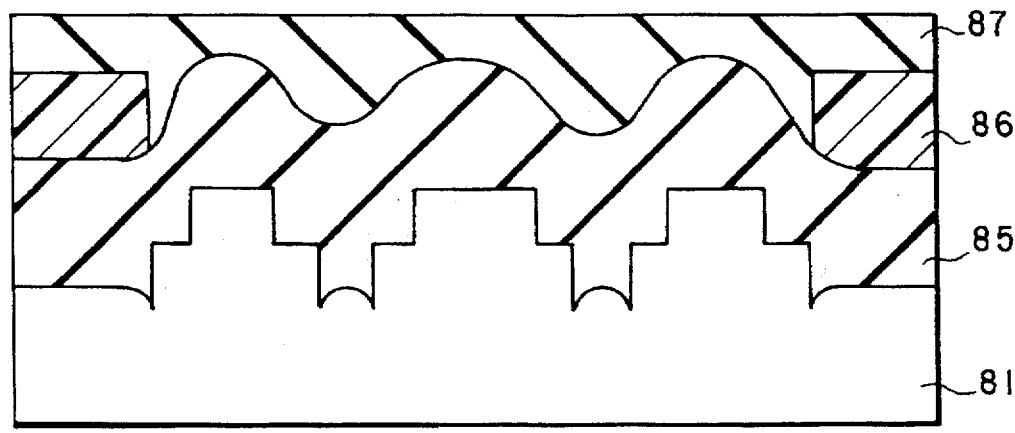

Thereafter, the thermal oxide film 82 and the first silicon oxide film 84 are removed with $NH_4F$ aqueous solution. Then, the second silicon oxide film 85 of a thickness of 2.4 µm is deposited by a CVD method. Further, a second resist pattern 86 of a thickness of 2.0 µm is formed on a wide element isolation region, and then coated with a third resist 87 having low viscosity, thereby flattening an uneven portion of the surface (FIG. 10D).

Figure 10E:
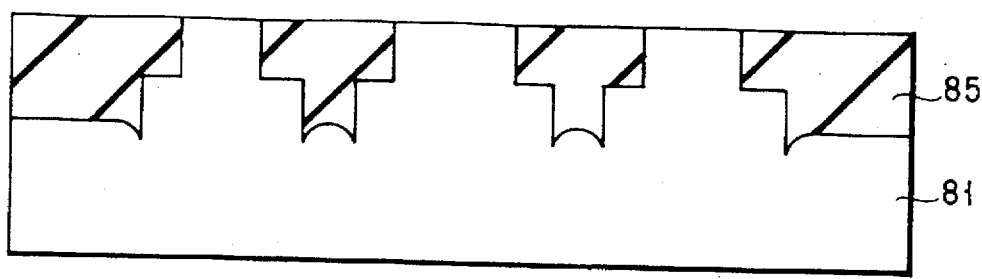

Then, it is etched under the condition that the etching rates of second and third resists 86, 87 and the second silicon oxide film 85 become equal by an RIE. At this time, the silicon oxide film 85 of 50 nm is retained on the insular portion. Thereafter, it is etched by 50 nm with $NH_4F$ aqueous solution (FIG. 10E).

Subsequently, after a dummy oxide film 90' of a thickness of 10 nm is formed, boron ions are implanted in the entire silicon substrate 81 at an accelerating voltage of 60 keV and dose of $6 \times 10^{12}$ $cm^{31\ 2}$, thereby forming a p-type well region 88. Thereafter, it is heat treated at 1,000° C. for 20 sec. in a nitrogen atmosphere by using a rapid thermal annealing method (RTA), thereby activating the boron ions.

Then, an impurity is implanted by using a high accelerating ion implanting method. However, the implantation of the impurity is not limited to this stage. For example, with the resist used as a mask, the impurity may be partly implanted. In this case, the case where the impurity is implanted in the entire surface will be described.

Figure 10F:
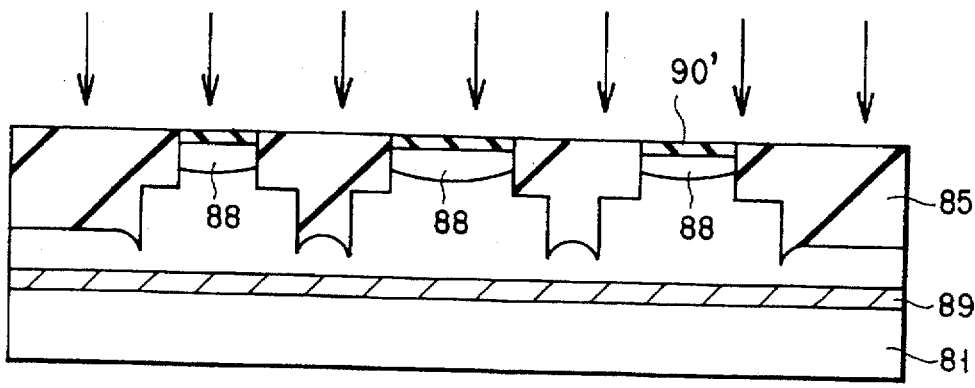

The impurity is implanted in a depth of the same degree as the depth of the second groove or deeper depth than the depth of the second groove in the entire surface by using a high speed ion implanting method, thereby forming a damage layer 89. The damage layer 89 is formed to terminate a crystal defect generated from the second groove (FIG. 10F).

Figure 10G:
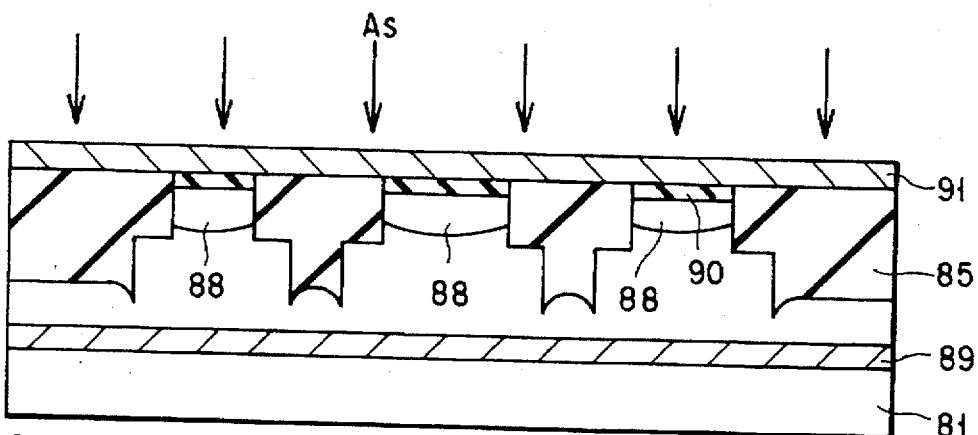

Thereafter, the dummy oxide film 90' is removed with NH$_4$F aqueous solution, and a gate oxide film 90 of a thickness of 10 nm is newly formed. Then, a polycrystalline silicon film 91 of a thickness of 200 nm is deposited on the entire surface, and then arsenic ions are implanted in the polycrystalline silicon film 91 at an accelerating voltage of 30 keV and dose of $5 \times 10^{15}$ cm$^{-2}$. Thereafter, it is heat treated at 1,000° C. for 20 sec. in a nitrogen atmosphere by using an RTA, thereby activating the arsenic ions (FIG. 10G).

Figure 10H:
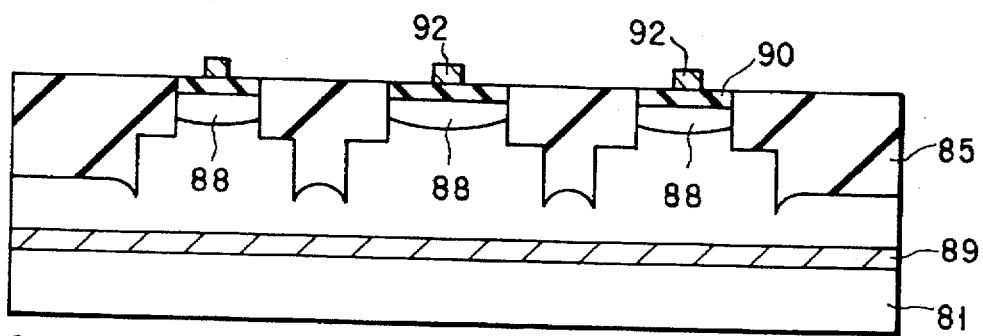
Figure 101:
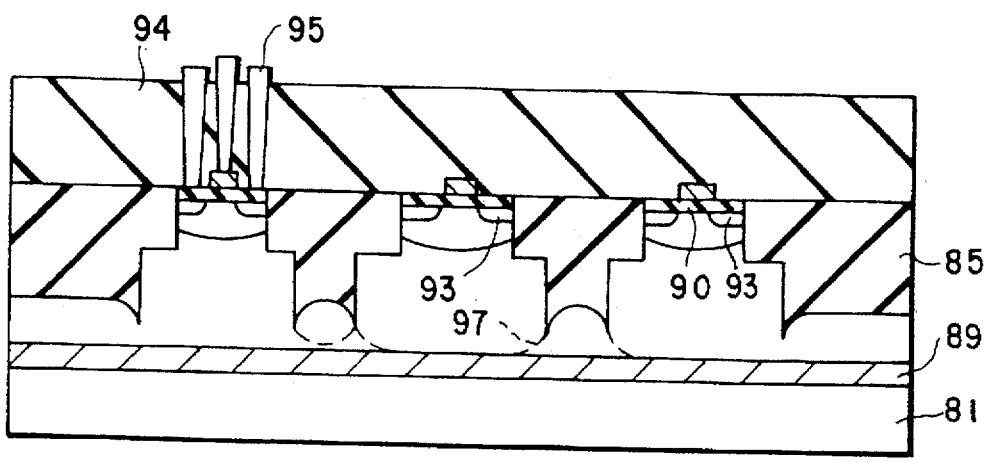

Then, with the resist pattern (not shown) used as a mask, the polycrystalline silicon film 91 is etched by an RIE, thereby forming a gate electrode 92 (FIG. 10H). Thereafter, according to manufacturing steps of ordinary N-type MOSFET, with the gate electrode 92 used as a mask, N-type impurity ions are implanted, thereby forming a diffused layer 93, and further a CVD oxide film 94 passivating step, a contact hole opening step and an Al wiring 95 forming step are conducted, thereby completing an N-type MOSFET (FIG. 10I).

According to the embodiment described above, the crystal defect is generated from the bottom of the second groove, the crystal defect 97 generated is terminated at the damage layer 89, the bottom of the second groove, or the bottom of the adjacent second groove, not extended to the element region, but the element region is resultantly in a free state. In the embodiment described above, the N-type MOSFET is used as the example. However, this embodiment may be similarly applied to a CMOS, a P-type MOSFET.

According to the embodiments 1 to 5 as described above, the crystal defect is previously generated in the deep portion of the semiconductor device using the trench isolation method, the element can be formed at the upper portion of the semiconductor substrate or the semiconductor layer in a defect free state in the state that the strain in the substrate is alleviated. Therefore, the junction leakage current due to the crystal defect can be reduced.

Embodiment 6

This embodiment shows various examples of preventing a crystal defect according to a pattern shape of a resist pattern.

Figure 11A:
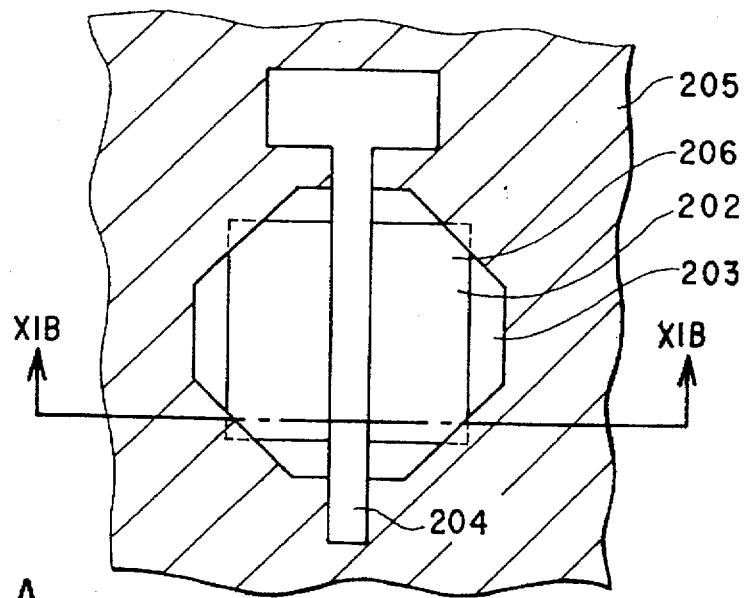
FIGS. 11A and 11B are a plan view and a sectional view of a semiconductor device according to a sixth embodiment of the present invention.
Figure 11B:
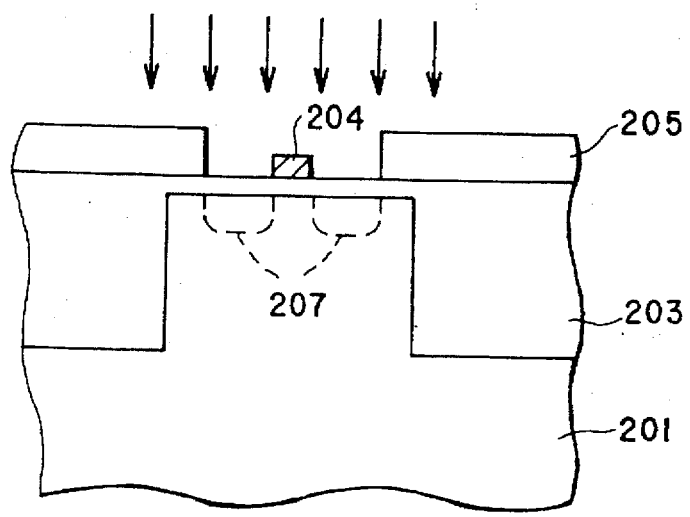

In an example illustrated in FIGS. 11A and 11B, a resist pattern in which a shape of an opening is of an octagonal shape is used. In FIGS. 11A and 11B, an element region 202 is isolated by an element isolation region 203, then a gate electrode 204 and the like is formed if necessary, and a resist pattern 205 for implanting an impurity is formed by using a photolithographic step. At this time, the resist pattern 205 is formed in a shape for covering a corner 206 of the element region.

When ions are implanted in this state to form an impurity region 207, a primary defect due to the ion implantation is not introduced into the corner 206 of the element region 202.

Therefore, even if the impurity is diffused from the impurity region 207 in the corner 206 of the element region 202 in a later heating step, a large defect such as a dislocation due to a stress concentration of the corner 206 of the element region 202 does not occur. The impurity is diffused in the corner 206 of the element region 202 in the later heating step, but its concentration is lower than the other portion of the element region.

In an example illustrated in FIG. 12, there is a rectangular element region 302 isolated by an element isolation region 301, a resist pattern 303 to become a mask at the time of ion implanting covers a corner 304 of the element region 302, thereby suppressing generation of a large crystal defect of ion implantation. Thus, the resist pattern 303 having a corner with only 90° may be used.

In an example illustrated in FIG. 13, an element region 402 of a complicated shape isolated by an element isolation region 401 is formed. A corner 405 of an element region in which a crystal defect is not possibly generated or may be generated without trouble is not covered with a resist 403, but a corner 404 of the element region 402 in which the crystal defect might be generated but is undesired to be generated is covered with the resist pattern 403. Thus, it is not necessary to cover all the corners of the element regions 402 with the resist patterns 403.

Figure 14:
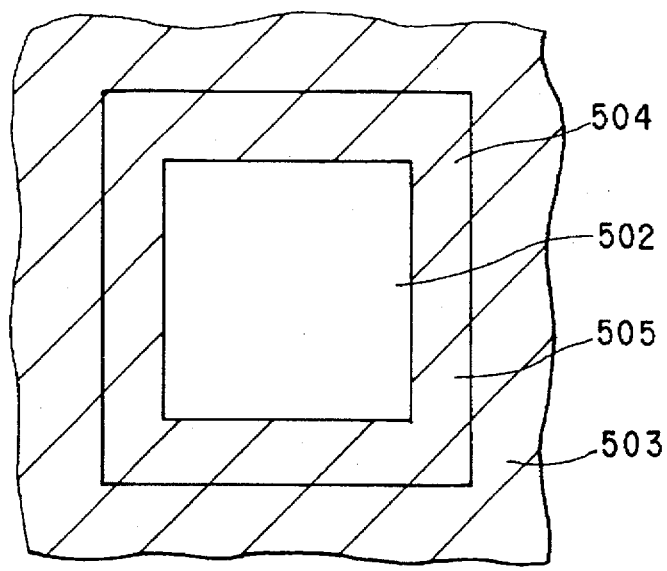

In an example illustrated in FIG. 14, not only a corner 504 of an element region 502 but also a side 505 thereof are covered with a resist pattern 503.

In the examples described above, the case of a trench element isolation has been described. However, even when an ordinary LOCOS method and the other element isolating method are used, similar effect can be obtained. In the examples described above, the resist pattern is used as the mask, and the impurity is implanted by the ion implantation. However, the similar effect can also be obtained even by implanting the impurity with an oxide film used as a mask by a solid phase or vapor phase diffusion or with a corner used as a mask by other method.

Figure 15:
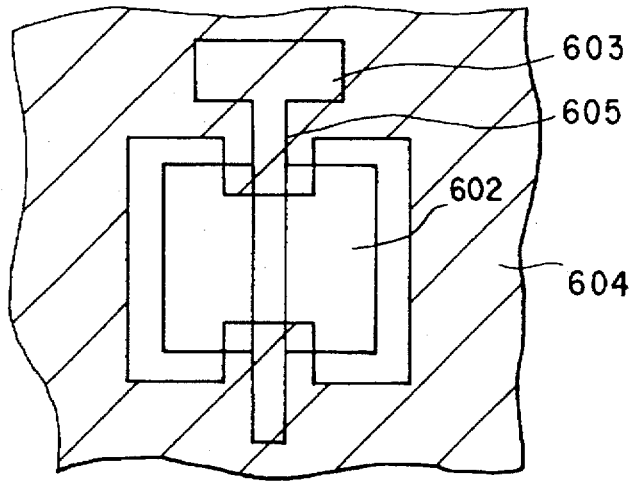

In an example illustrated in FIG. 15, an end 605 of a region in which an element region 602 and a gate electrode 603 are superposed is also covered with a resist pattern 604. This is because a stress is concentrated also at the end 605 of the region in which the element region 602 and the gate electrode 603 are superposed, and thus the similar effect to that of the above-described example can be obtained.

Figure 16:
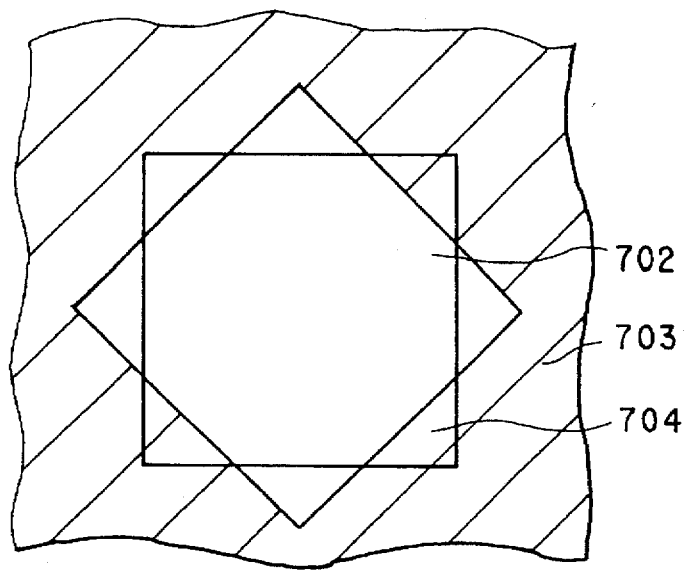

In an example illustrated in FIG. 16, a resist pattern 703 having an opening of the same shape as a element region 702 and altered at a position to so dispose as to cover a corner 74 of the region 702 is shown.

According to the sixth embodiment as described above, the shape of the resist pattern is so selected that the corner of the element region in which the stress is concentrated and the portion in which the impurity is implanted are not superposed. Therefore, a large dislocation can be prevented, thereby reducing the junction leakage current due to the crystal defect.

Embodiment 7

Figure 17:
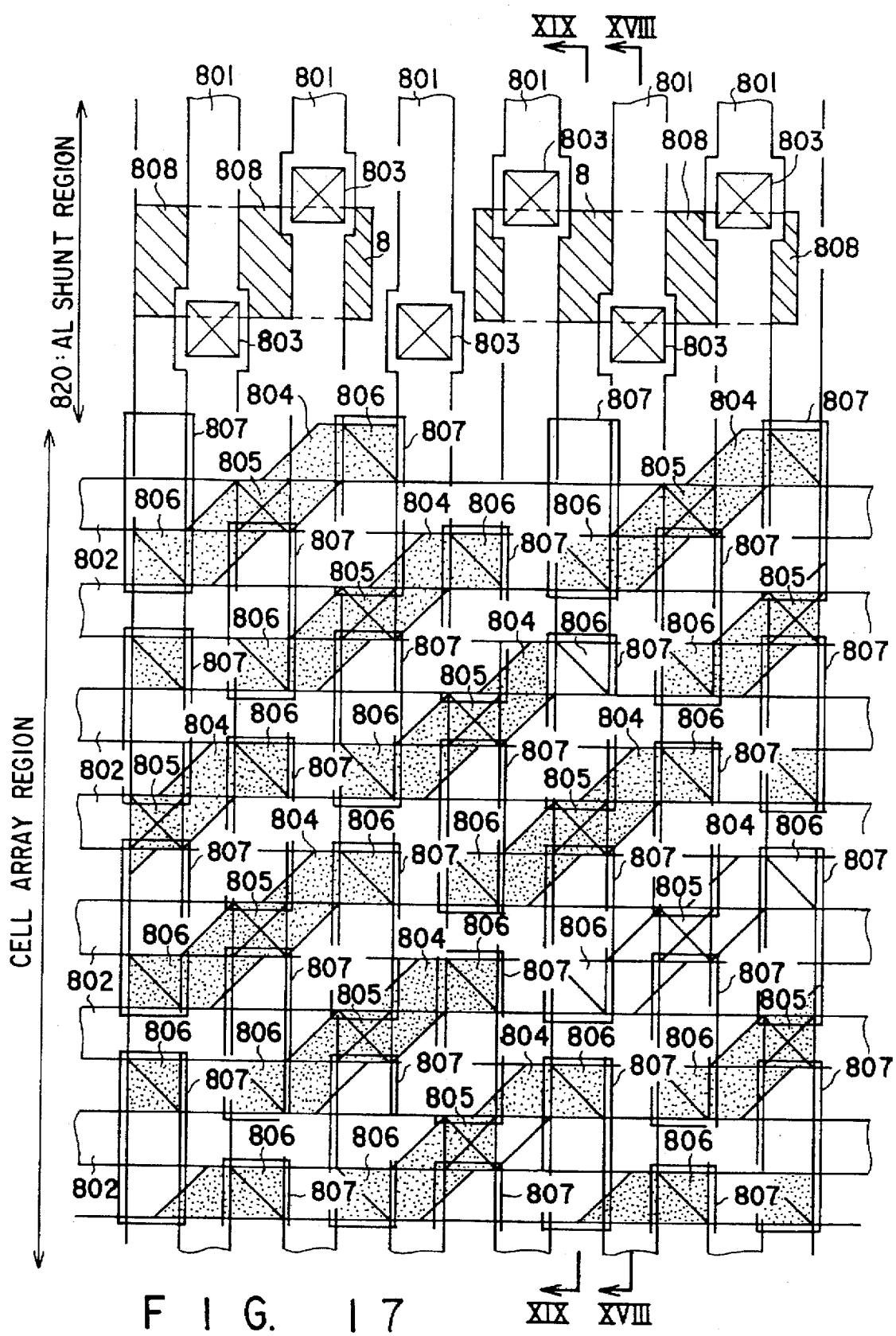
FIG. 17 is a plan view showing a semiconductor device according to a seventh embodiment of the present invention.
Figure 18:
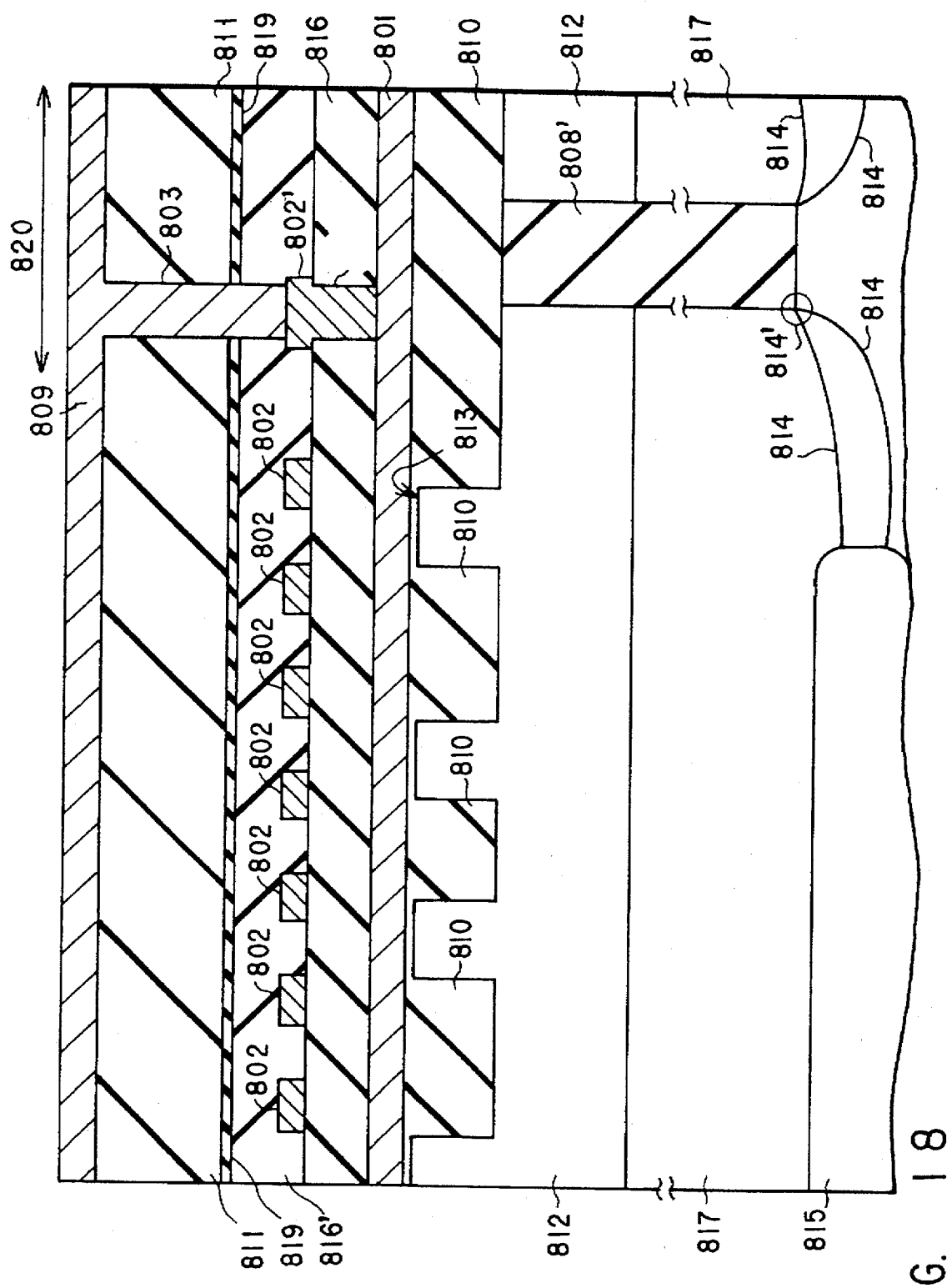
FIG. 18 is a sectional view taken along the line XVIII—XVIII of FIG. 17.
Figure 19:
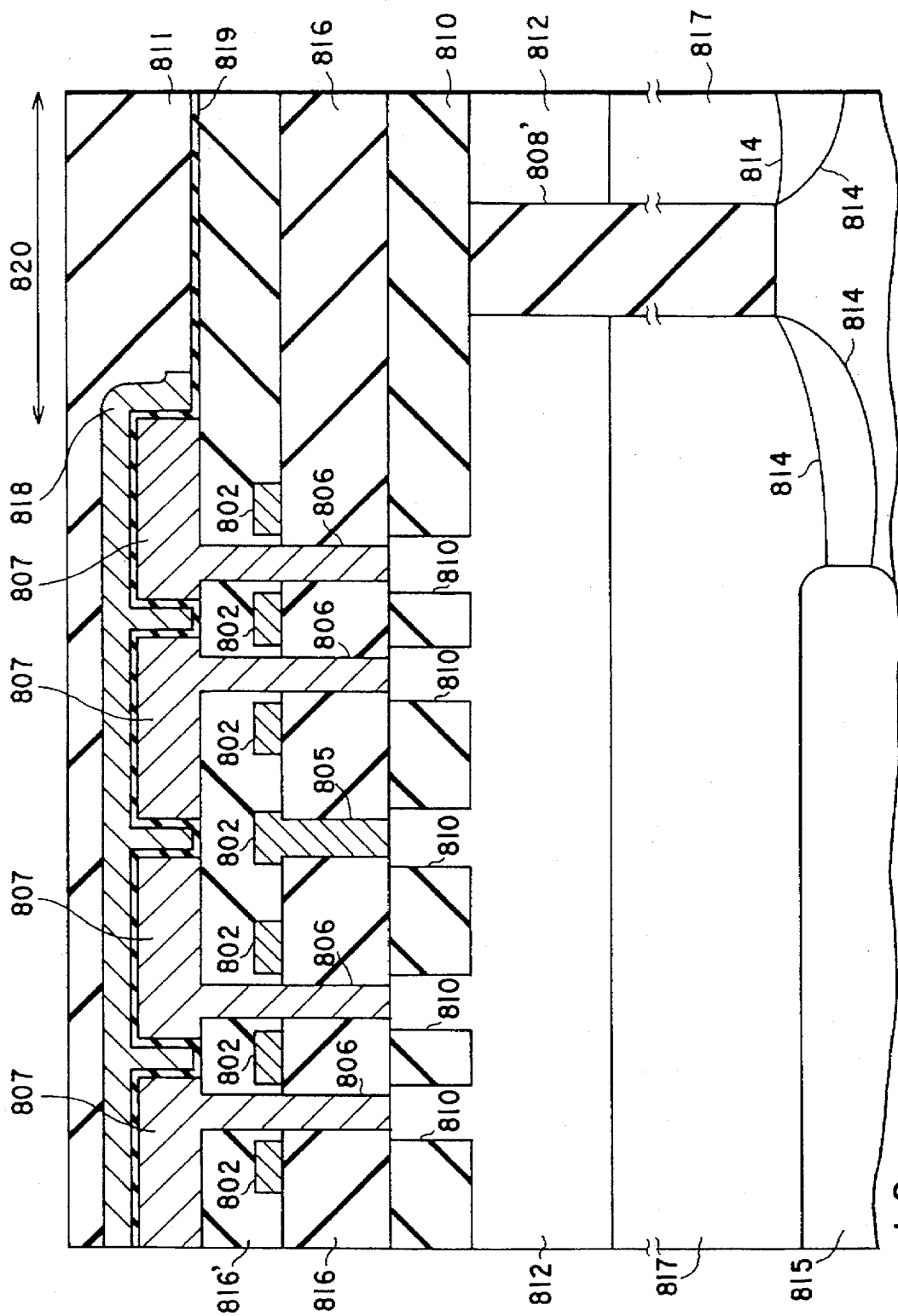
FIG. 19 is a sectional view taken along the line XIX—XIX of FIG. 17.

FIG. 17 is a plan view showing a portion of a DRAM (dynamic random access memory) cell array using a stack type capacitor according to a seventh embodiment of the present invention, FIG. 18 is a sectional view taken along the line XVIII—XVIII of FIG. 17, and FIG. 19 is a sectional view taken along the line XIX—XIX of FIG. 17. FIGS. 18 and 19 are sectional views showing the case where the manufacturing steps are advanced till the formation of an initial metal wiring .(first A1).

To reduce a resistance of a gate wiring 801, a metal wiring (Al in this example) 809 having substantially the same width as that of a gate wiring and extending in the same direction as that of the gate wiring directly above the gate wiring is formed, and contacts 803 for connecting in places the metal wiring 809 to the gate electrode 801 is formed. In this example, a region provided with the contact is called "an Al shunt region 820", an interval between the Al shunt region 820 and another Al shunt region ranges several tens to hundred and several tens of micron in a DRAM of a gigabit level.

In this embodiment, since a device such as a transistor or the like is not formed in an Si substrate under the Al shunt region 820, a defect concentrated layer 808 is formed thereat. A method for concentrating a defect at the region 808 may be any, and FIGS. 17 to 19 illustrate a method for inducing a defect by forming a deep groove 808' in the region 808.

As illustrated in FIGS. 18 and 19, when the deep groove 808' is formed in the Si substrate under the Al shunt region 820 and the groove 808' is embedded with an insulator, a crystal defect 814 in which a corner of a bottom of a groove is used as an end point (starting point) 814' is easily generated. The other end point (ending point) may position at a corner of a bottom of the other groove, or a high strain layer (e.g., a high concentration impurity layer 815) formed in the same depth or deeper than the bottom of the groove may be formed in the substrate of a cell array region. The drawings illustrate the latter. If the crystal defect is generated only at the bottom of the groove and not extended to the element region, the high concentration impurity layer 815 may not be present.

A method for manufacturing a semiconductor device according to the seventh embodiment will be simply explained. First, an Si wafer 817 of a surface orientation (100) is prepared, and a high concentration impurity region 815 is formed at a position of a depth of, for example, about 5 μm from a surface of the wafer 817 by a high acceleration ion implantation or solid-phase diffusion and epitaxial growth. Thereafter, a groove 808' of the depth of the same degree is formed, and embedded with an $SiO_2$ insulator. Then, boron is ion implanted and thermally diffused to form a P-type well 812 of a depth of 2–3 μm.

Then, to form an element isolation region, a patterning by a lithography is executed, a shallow groove 810 of a depth of about 0.5 μm is formed, the groove 810 is embedded with $SiO_2$ insulator, thereby flattening the surface. In this example, to permit a contact of a capacitor to be easily formed, a plane pattern shape of the element active region 804 is designed obliquely to a gate wiring 801. In this case, a trench isolation is employed as an element isolation method. However, a LOCOS method may be employed.

Then, a gate oxide film 813 of a thickness of about 6 nm is formed by a thermal oxidation, a polysilicon of a thickness of 150 nm is further deposited, an impurity is doped, and WSi (tungsten silicide) is sputtered. Then, the polysilicon layer and the WSi layer are patterned by a lithography and an IRE, thereby forming a gate wiring 801.

Subsequently, after a source and drain diffused regions (not shown) are formed, an $SiO_2$ film 816 is deposited as an interlayer insulating film in a thickness of about 300 nm by a CVD method, and flattened by a CMP (chemical mechanical polishing).

After a bit line contact hole 805 is formed in the interlayer insulating film 816, polysilicon is deposited in a thickness of about 350 nm, ion implanted and etched back by an RIE, thereby embedding the polysilicon in the contact hole 805. In addition, the doped polysilicon and WSi are respectively formed in thicknesses 50 and 150 nm, forming a bit line 802 by patterning. At this time, frequency, a contact hole 803' of an Al shunt portion and an a plug 802' due to the bit line are simultaneously formed. Thus, when a gate is connected via a contact of the Al wiring, an aspect ratio of the contact may be conveniently small.

Then, an $SiO_2$ film 816' is deposited as an interlayer insulting film in a thickness of about 300 nm by a CVD method, and flattened. Then, a capacitor contact 806 is opened, and a lower electrode (storage node: 807) is formed, for example, by using a doped polysilicon. As a capacitor insulating film 819, a $Ta_2O_5$ film formed by a CVD is, for example, used, an annealing process for reducing a capacitor leakage is executed, and an upper electrode (plate: 818) is formed, for example, by sputtering a TiN layer and an RIE.

Further, an interlayer insulating film (811) made of $SiO_2$ is deposited to be formed thereon, a contact hole 803 is opened, and a barrier metal (Ti/TiNO layer and an Al layer 809 are formed by sputtering. Eventually, the Al layer 809 is patterned, and a DRAM cell array of a structure as illustrated in FIGS. 17 to 19 is formed.

Embodiment 8

Figure 20:
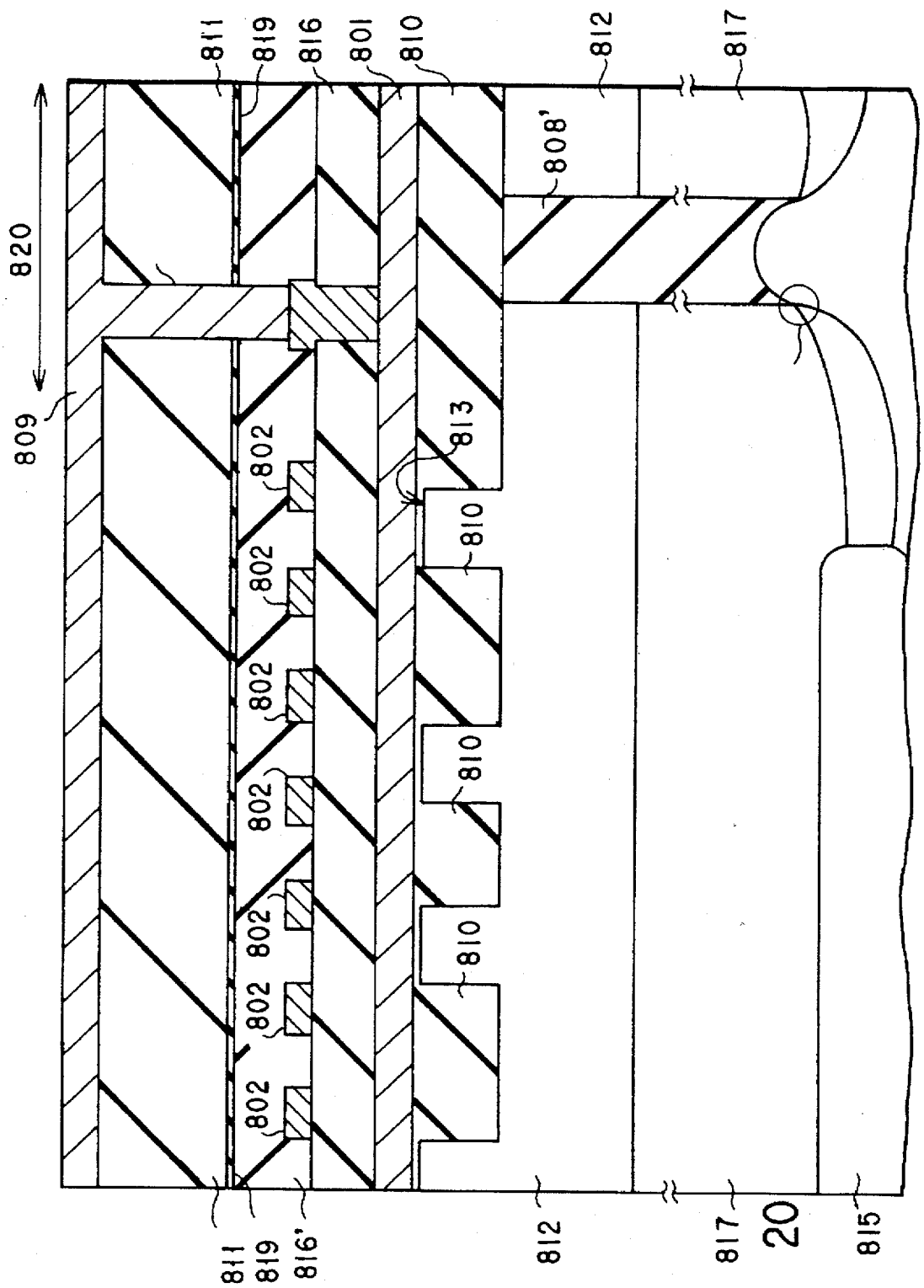
FIG. 20 is a sectional view showing a semiconductor device according to an eighth embodiment of the present invention.

FIG. 20 illustrates a portion of a DRAM cell array according to an eighth embodiment of the present invention, corresponding to a sectional view taken along the line XVIII—XVIII of FIG. 17. The point that a groove deeper than a well is formed on an Al shunt region is similar to that of the above-described seventh embodiment, but a feature resides in a shape of a bottom of a groove. More specifically, etching conditions are optimized to form a deeper sharp angle portion 814" than a central portion is formed at an edge portion of the bottom of the groove. Thus, a stress is feasibly concentrated at the edge portion of the bottom of the groove, and a defect is concentrated. In this case, a high strain layer (e.g., a high concentration impurity layer: 815) may be or may not be present.

Embodiment 9

Figure 21:
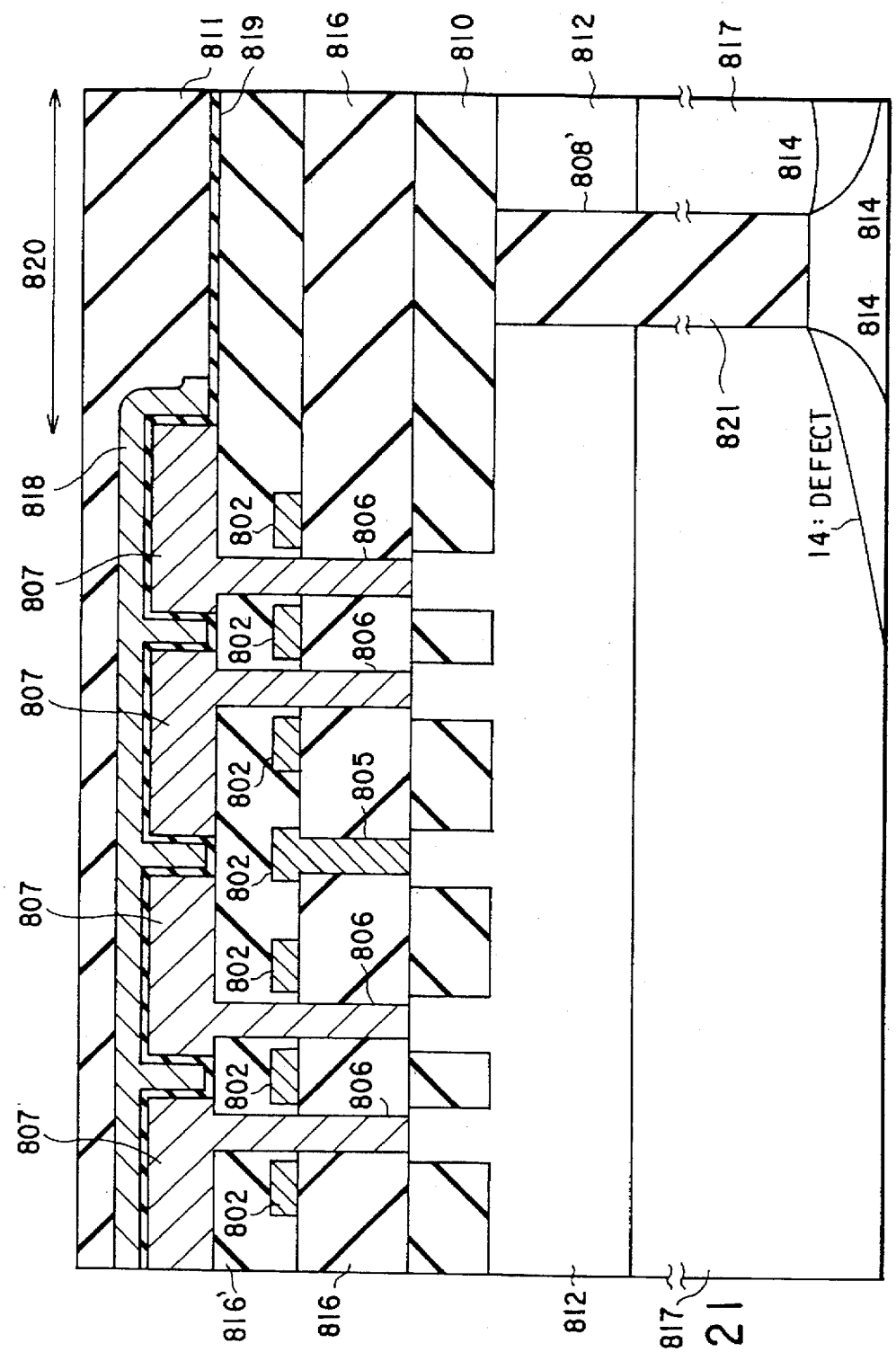
FIG. 21 is a sectional view showing a semiconductor device according to a ninth embodiment of the present invention.

FIG. 21 illustrates a portion of a DRAM cell array according to ninth embodiment of the present invention, corresponding to a sectional view taken along the line XIX—XIX of FIG. 17. The point that a deeper groove than a well is formed under the Al shunt region is similar to those of the above-described embodiments 7 and 8, but a feature resides in a material to be embedded in a groove 808'. More specifically, the embedding material 810 of the element isolation region is the insulator made of $SiO_2$, whereas a film for generating a higher stress than the $SiO_2$ of SiN or the like, i.e., a high stress 821 is embedded in the groove 808'. When the high stress film 821 is existed, a defect 814 is feasibly generated from the film 821, thereby becoming a defect or metal gettering sink in the element region.

Embodiment 10

Figure 22:
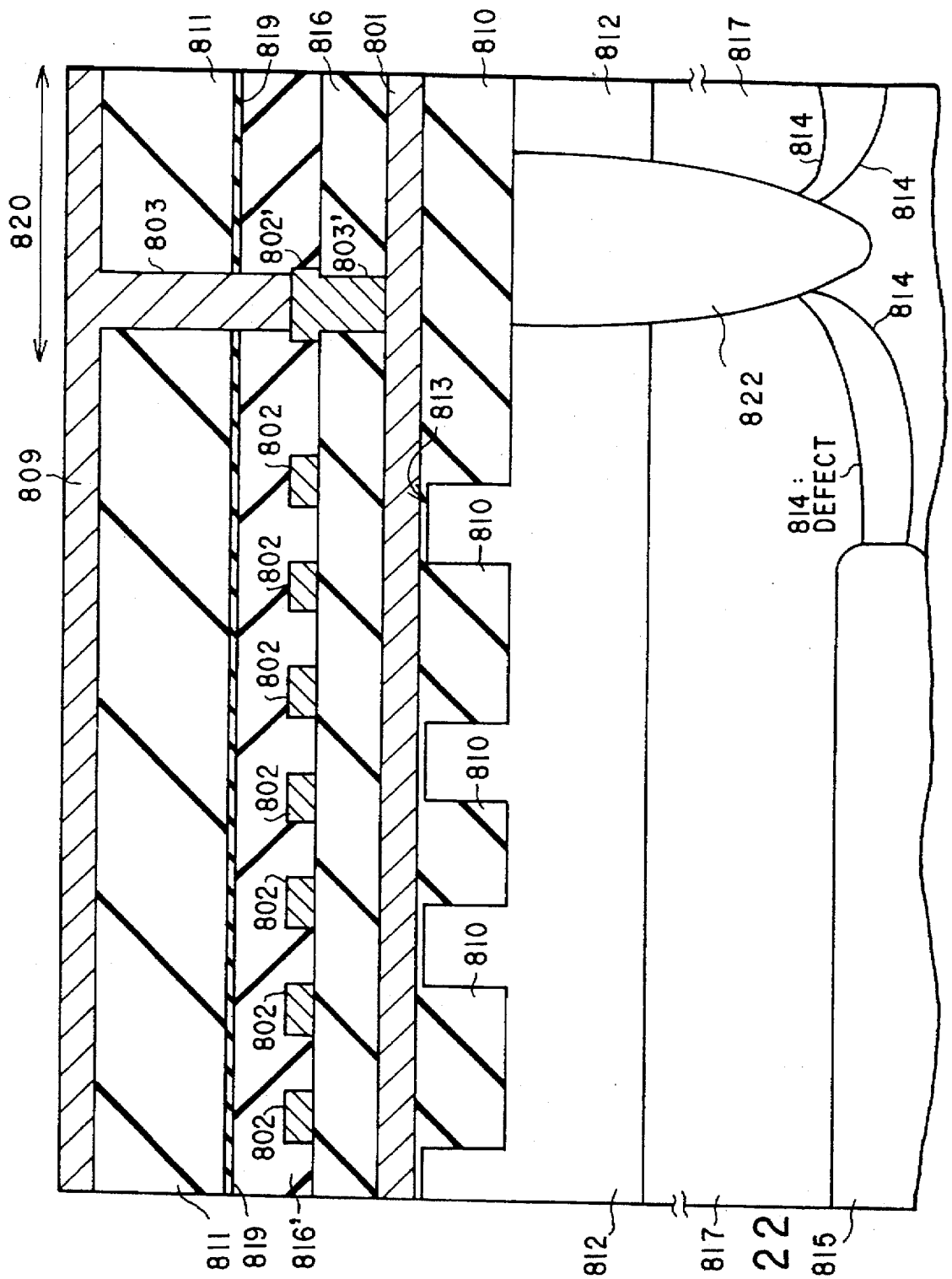
FIG. 22 is a sectional view showing a semiconductor device according to tenth embodiment of the present invention.

FIG. 22 illustrates a portion of a DRAM cell array according to a tenth embodiment of the present invention, corresponding to a sectional view taken along the line XVIII—XVIII of FIG. 17. A high strain layer (high concentration impurity layer: 822) is formed under the Al shunt region of the DRAM cell array according to this embodiment by local ion implantation. A crystal defect is feasibly generated from the high strain layer, thereby becoming a defect or metal gettering sink in the element region. Even in this case, the high strain layer (e.g., a high concentration impurity layer: 815) may be or may not be present.

Embodiment 11

Figure 23:
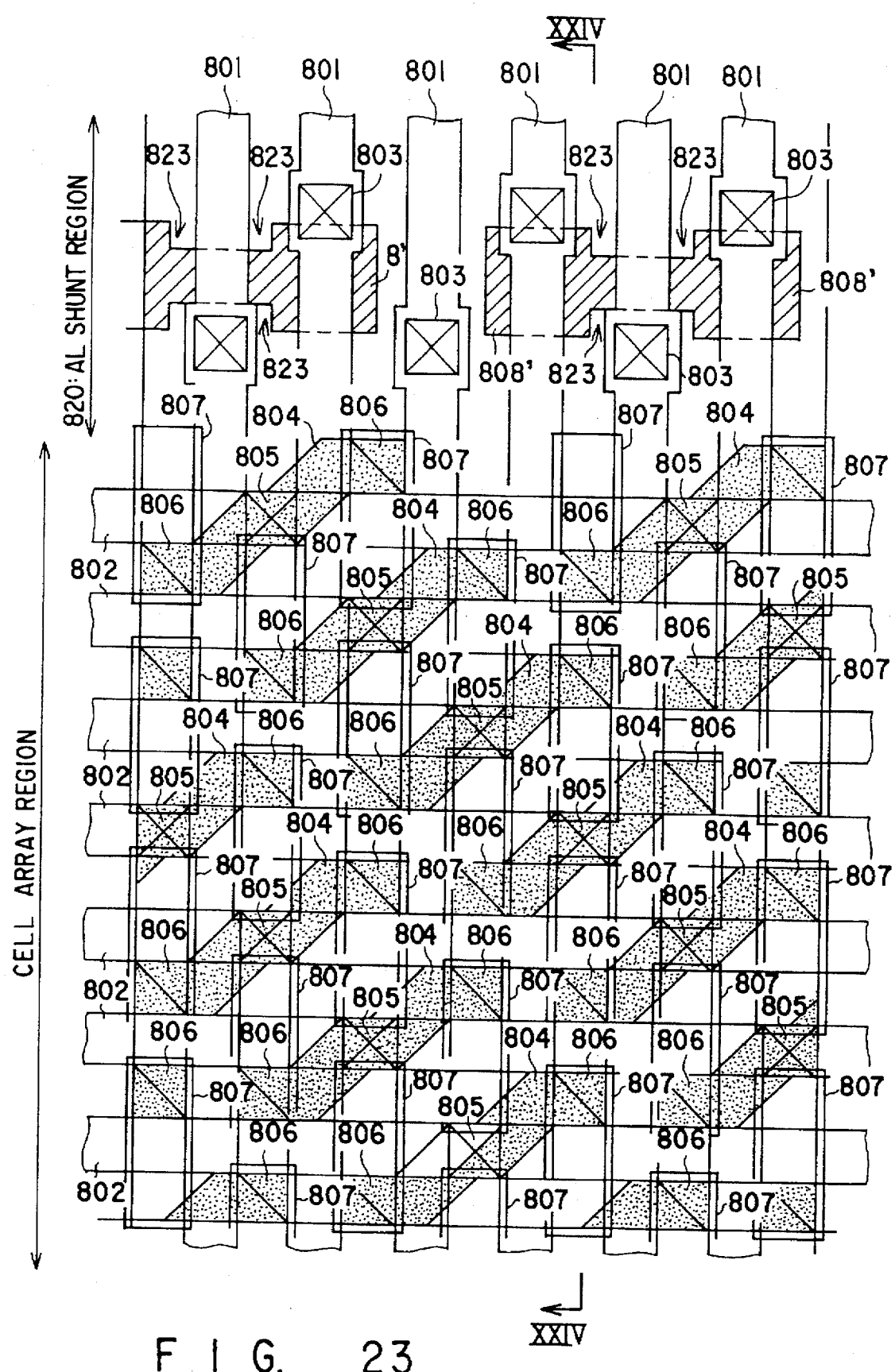
FIG. 23 is a plan view showing a portion of a DRAM cell array according to an eleventh embodiment of the present invention.

FIG. 23 is a plan view illustrating a portion of a DRAM (dynamic random access memory) cell array using a stack type capacitor according to an eleventh embodiment of the present invention, and FIG. 24 is a sectional view taken along the line XIX—XIX of FIG. 23. The point that a deeper groove than a well is formed under the Al shunt region is similar to the above-described embodiment, but a plan pattern of the groove 808' has following feature.

More particularly, there is a portion (or a corner) 823 in which a width of a groove is abruptly narrowed, and a stress concentration is feasibly generated. Therefore, a crystal defect is easily generated from the portion 823, thereby becoming a defect or a metal gettering sink in the element region. Even in this case, the high strain layer (e.g., a high concentration impurity layer: 815) may be or may not be present.

According to the embodiments 7 to 11 as described above, a defect concentrated region for gettering (sucking) the crystal defect is formed out of the element region. Therefore, the defect is scarcely generated in the element region, and the defect and metal contamination generated in the element region are removed by the defect concentrated region. Thus, device characteristics such as junction leakage current characteristics, gate oxide film reliability and the like are remarkably improved. Further, the defect concentrated region is disposed in the region (the region not used for a MOSFET due to specific reason: e.g., the Al shunt region of DRAM) where a device such as a MOSFET, etc., is not normally formed. Therefore, an increase of an area is not caused. That is, a vacant space can be effectively utilized as a gettering sink for the crystal defect and the metal.

A twelfth embodiment 12 which will be described relates to the fourth aspect of the present invention.

Embodiment 12

FIG. 25A is a plan view schematically illustrating a main portion of a structure of a CMOS integrated circuit having a trench isolation structure according to a twelfth embodiment of the present invention, and FIG. 25B is a sectional view taken along the line XVIII—XVIII of FIG. 25A.

The CMOS integrated circuit comprises a region 91 having a plurality of p-type MOS elements 913 formed at an isolation region 912 formed in a surface of a p-type Si substrate 911, a region 916 having a plurality of n-type MOS elements 915 formed, and further a gettering region 917 formed as a high concentration impurity region on outer peripheries of the element regions 914, 916.

The isolation region 912 formed by embedding an insulator such as an oxide film or the like in a groove 911a selectively formed in the Si substrate 911 by a so-called "trench isolation method", and elements 913, 915 in the element regions 914, 916 are electrically isolated from one another by the isolation region 912.

The above-described p-type MOS elements 913 are regularly formed in the n-type well region 918 provided on the Si substrate 911 corresponding to the element regions 914, and each has a gate electrode 922 formed on the n-type well region 918 via a gate oxide film 921, and a p-type diffused region (low concentration impurity layer) 923 to become a source and drain region formed in the surface of the n-type well region 918 except a portion directly under the gate electrode 922.

This diffused region 923 is formed, for example, by implanting boron ions at an accelerating voltage of 30 keV and dose of $3 \times 10^{15}$ cm$^{-2}$ by an ion implanting method.

The n-type MOS elements 915 are regularly formed on the surface of the Si element 911 corresponding to the element region 916, and each has a gate electrode 922 provided on the Si substrate 911 via a gate oxide film 921, and an n-type diffused region (low concentration impurity region) 924 to become a source and drain regions formed in the surface of the Si substrate 911 except a portion directly under the gate electrode 922.

The diffused region 924 is formed, for example, by implanting phosphorus ions at an accelerating voltage of 40 keV and dose of $3 \times 10^{15}$ cm$^{-2}$ by an ion implanting method.

The gettering region 917 is a diffused region in which impurities such as boron and phosphorus are implanted upon formation of the diffused regions 923, 924, such as, for example, thereby becoming a high concentration region in which the impurity is implanted with total dose of $6 \times 10^{15}$ cm$^{-2}$.

According to such a structure, the crystal defect is feasibly generated in the elements 914, 916 in which the elements 913, 915 are concentrated densely, but the gettering region 917 is provided on the region except the element regions 914, 916, i.e., the outer peripheries of the element regions 914, 916 thereby to intentionally generate a large quantity of the defects, thereby suppressing generation of the crystal defect in the element regions 914, 916. This is because the stress strain of the oxide film embedded in the groove 911a can be alleviated by the gettering region 917.

Even when a fine defect is temporarily generated in the element region 914, 916, metal impurity introduced by the defect can be forcibly drawn by the gettering region 917.

Therefore, in a CMOS integrated circuit in which the trench isolation structure is employed, an increase of a junction leakage current and a decrease of a breakdown voltage of the gate oxide film 921 can be improved, thereby preventing an operating malfunction of the integrated circuit and enhancing its performance.

Then, a method for manufacturing a CMOS integrated circuit having the above-described trench isolation structure will be described.

FIGS. 26A to 26E schematically illustrate a manufacturing process of the CMOS integrated circuit.

First, as illustrated in FIG. 26A, the groove 911a is formed in a depth of 0.5 μm in the p-type Si substrate 911 provided with the n-type well region 918 corresponding to the element region 914 formed with the p-type MOS element 913, with the resist (not shown) used as a mask, by an RIE (Reactive ION Etching) method.

After the resist is removed, the oxide film 931 is deposited in a thickness of 0.7 μm by a reduced pressure CVD (Chemical Vapor Deposition) method.

Figure 26B:
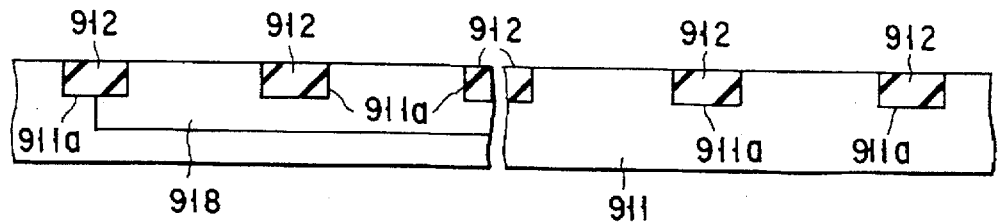

Thereafter, as illustrated in FIG. 26B, the upper surface of the oxide film 931 is flattened by mechanical polishing, and the isolation region 912 is formed except the oxide film 931 only in the groove 911a.

Figure 26C:
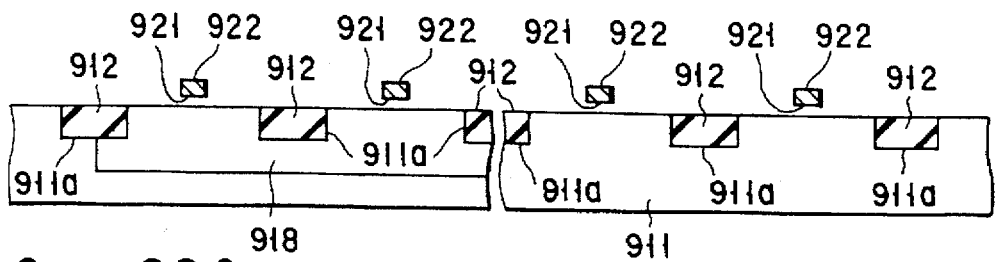

Then, as illustrated, for example, in FIG. 26C, after the gate oxide film 921 is formed in a thickness of 10 nm, a polycrystalline silicon film containing high concentration of phosphorus is deposited, and further patterned, thereby forming the gate electrode 922. At this time, the gate electrode 922 is not formed in the region to become the gettering region 917, i.e., the region except the element regions 914, 916.

Figure 26D:
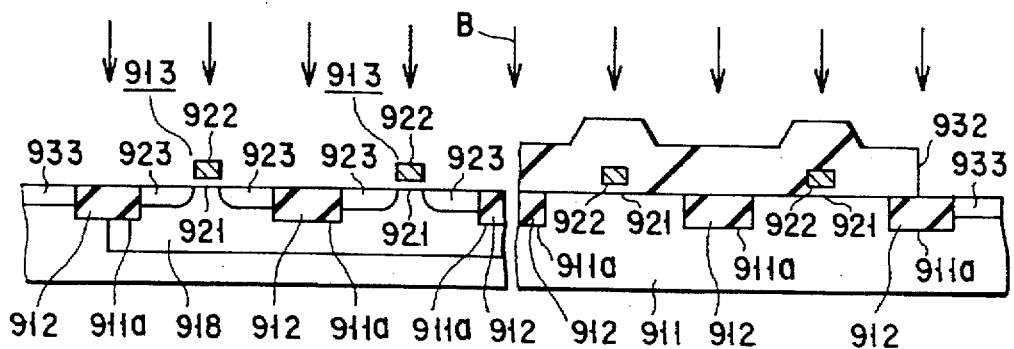

Subsequently, as illustrated in FIG. 26D, the resist 932 is patterned only on the upper surface of the element region 916 for forming the n-type MOS element 915, and thereafter boron ions (B) are implanted at an accelerating voltage of 30 keV and dose of $3\times10^{15}$ cm$^{-2}$ by an ion implanting method. Thus, the p-type diffused region 933 is simultaneously formed on the outer peripheries of the element regions 914, 916 to become the gettering regions 917 together with the diffused region 923 to become the source and the drain of the p-type MOS element 913.

Figure 26E:
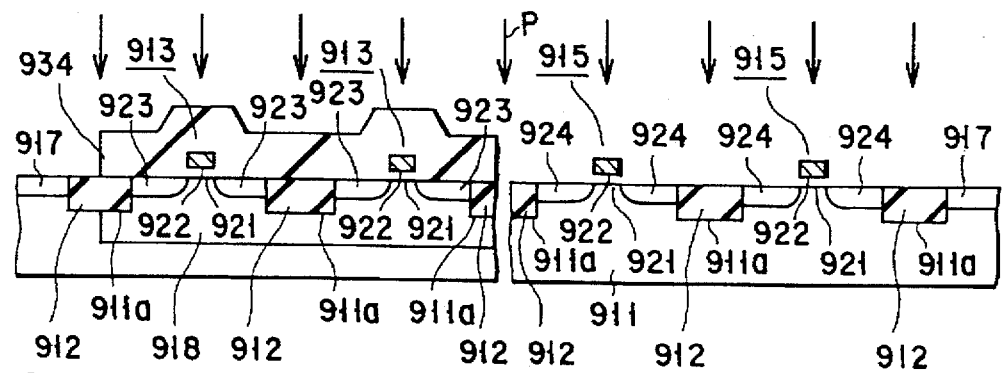

Similarly, as illustrated, for example, in FIG. 26E, after the resist 932 is removed, the resist 34 is patterned only on the upper surface of the element region 914 formed with the p-type MOS element 913, and further phosphorus ions (P) are implanted at an accelerating voltage of 40 key and dose of $3\times10^{15}$ cm$^{-2}$ by an ion implanting method. Thus, the phosphorus ions are doped even in the p-type diffused region 933 of the outer peripheries of the element regions 914, 196 together with the diffused region 924 to become the source and the drain of the n-type MOS element 15, thereby forming the high concentration gettering region 917 of $6\times10^{15}$ cm$^{-2}$.

Incidentally, the implantations of the boron ions and the phosphorus ions may be sequentially executed.

Thereafter, the resist 934 is removed, thereby manufacturing the CMOS integrated circuit of the structure as illustrated in FIGS. 25A and 25B.

The diffused regions 917, 923, 924 are, for example, annealed at 800° C. for 30 min. in a nitrogen atmosphere.

Eventually, the passivation film, the contact hole and the Al wirings are formed by ordinary manufacturing method, thereby completing the CMOS integrated circuit having the trench isolation structure.

As described above, a stress strain due to the oxide film can be alleviated.

More specifically, the gettering region is provided on the outer periphery of the element region, thereby intentionally generating a large quantity of the defects. Thus, since an environment in which the crystal defect can be feasibly generated out of the element region can be previously prepared, the crystal defect can be scarcely generated in the element region. Even when a fine defect is temporarily generated in the element region, the metal impurity introduced by the defect can be forcibly drawn. Therefore, in the CMOS integrated circuit in which the trench isolation structure is employed, an increase of the junction leakage current and a decrease of a breakdown voltage of the gate oxide film can be improved, thereby enhancing the performance.

In the embodiment 12 described above, the CMOS integrated circuit formed by using the p-type Si substrate is used as the example. However, the present invention is not limited to the particular embodiment. For example, this embodiment may be similarly applied to the CMOS integrated circuit formed by employing an n-type Si substrate.

This embodiment is not limited to the MOS element. However, this embodiment may be applied to a bipolar element, and can be applied, for example, a Bi-CMOS integrated circuit.

Further, the gettering region is not limited to the case formed by mixing the phosphorus ions and the boron ions. For example, impurities of at least two or more types of impurities such as boron, arsenic, germanium, antimony, argon, nitrogen, silicon, etc., may be introduced by an ion implanting method.

The gettering region is formed simultaneously upon ion implanting of the diffused region forming step of the MOS element. However, the gettering region may be formed in a separate step or by another method.

An oxide film containing $O_3$ in the oxide film embedded in the groove may be used. In this case, the trench isolation region can be formed more stably.

As the method for flattening the oxide film embedded in the groove, etching-back by a PIE method may be, for example, employed without using the above-described mechanical polishing.

Further, the embodiment may be applied to a MOS memory in which a plurality of MOS memory cells are arrayed in a close density in a repeating form.

Figure 27A:
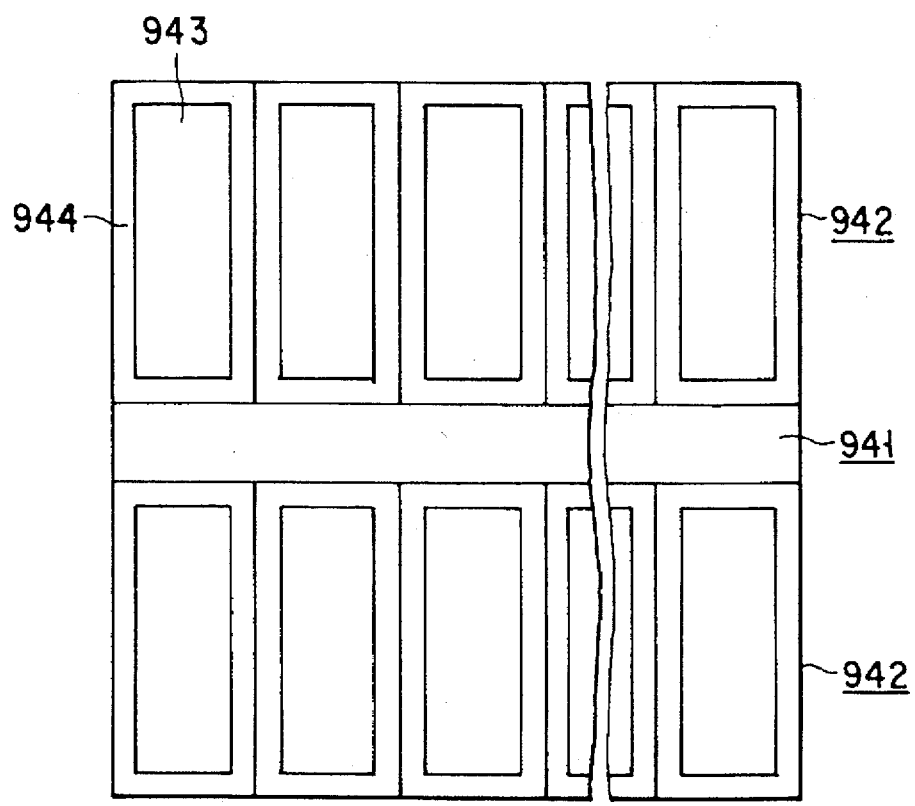
FIGS. 27A and 27B are schematic structural views of a MOS memory according to a modified example of the twelfth embodiment of the present invention.
Figure 27B:
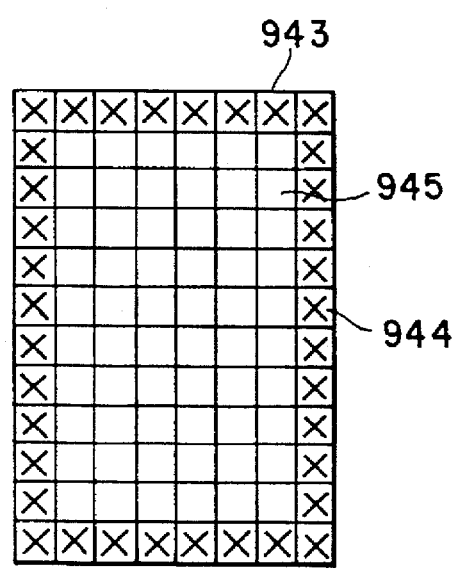

FIGS. 27A and 27B schematically illustrate an application example of the case that a gettering region is applied to a MOS memory in which trench isolation structure is employed.

This MOS memory has, as illustrated in FIG. 27A, a peripheral circuit 941 and a memory array 942, with the structure that gettering regions 944 are disposed on peripheries of the respective cell arrays 943 of a memory array section 942.

In this case, the gettering region 944 may be provided separately from the cell array 943, or as illustrated in FIG. 27B, the memory cell (cell marked with a mark "x") 945 disposed on the outermost periphery of the memory cell 45 of the MOS structure in which the cell arrays 943 are repeatedly arrayed in an array state is employed as the gettering region 944.

In addition, the present invention is not limited to the particular embodiments described above. Various modifications may be performed.

According to the twelfth embodiment as described in detail above, there is provided the semiconductor device in which the generation of the crystal defect and introduction of the metal impurity due to the defect in the element region can be suppressed and an increase of the junction leakage current or a decrease of a breakdown voltage of the gate oxide film can be improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a semiconductor element formed in a surface region of the semiconductor substrate;

a groove formed in the semiconductor substrate so that at least a bottom portion of the groove extends deeper into the semiconductor Substrate than a bottom boundary of the surface region; and wherein a substrate having a thermal expansion coefficient different from a thermal expansion coefficient of said semiconductor substrate is embedded at least in part of said groove so that a crystal defect is generated in said semiconductor substrate adjacent to said bottom portion of the groove after heat processing, said crystal defect generation alleviating stress and strain in other regions of the semiconductor device so that a crystal defect is not generated in a region of said semiconductor device that will interfere with operation of said semiconductor element.

2. A semiconductor device comprising:

a semiconductor substrate having a first groove extending to a depth below a surface of the semiconductor substrate, said groove being embedded with a first substance;

a semiconductor layer formed on the surface of the semiconductor substrate and having a second groove, said second groove being embedded with a second substance;

a semiconductor element formed in the semiconductor layer apart from said second groove; and wherein said first substance, said second substance, said semiconductor layer, and said semiconductor substrate all have a different thermal expansion coefficient with a difference between the thermal expansion coefficients of said second substance and said semiconductor layer being smaller than a difference between the thermal expansion coefficients of said first substance and said semiconductor substrate so that after heat processing a crystal defect is generated from a bottom portion of said first groove in said semiconductor substrate, said crystal defect generation alleviating stress and strain in other regions of the semiconductor device so that crystal defects are only generated in a region remote from operational areas of the semiconductor device.

3. A device according to claim 2, wherein a plurality of semiconductor elements are formed in said semiconductor layer, and the semiconductor elements are electrically isolated from each other by said second groove and said second substance embedded in the second groove.

4. A device according to claim 2, wherein said semiconductor layer is formed of an epitaxially grown layer.

5. A device according to claim 2, wherein a thickness of said semiconductor layer is larger than width of a depletion layer formed by a p-n junction of said semiconductor element.

6. A semiconductor device comprising:

a semiconductor substrate having a first groove and a second groove formed in a bottom portion of said first groove so that said second groove extends deeper into said semiconductor substrate than said first groove; and a semiconductor element formed in an element region of the semiconductor substrate isolated by said first groove of said semiconductor substrate from other regions of said semiconductor substrate, wherein said first and second grooves are embedded with at least one insulating material and configured so that a crystal defect is generated in said semiconductor substrate from a bottom portion of said second groove after heat processing, said crystal defect generation alleviating stress and strain in the element region of said semiconductor substrate so that crystal defects are only generated in a region remote from operational areas of said semiconductor element.

7. A device according to claim 6, wherein a width of said second groove is smaller than a width of said first groove.

8. A device according to claim 6, wherein a ratio of a total depth of said first and second grooves to an interval between adjacent second grooves is $\sqrt{2}$ or more.

9. A semiconductor device comprising:

a semiconductor substrate having an element region with at least one corner;

a semiconductor device formed in said element region of the semiconductor substrate; and wherein the at least one corner of said element region or at least one end of a region of said element region underlying a gate electrode of the semiconductor device has an impurity concentration which is lower than an impurity concentration of any other portion of said element region to avoid generation of a crystal defect at the at least one corner or at the at least one end after heat processing.

10. A semiconductor device comprising:

a semiconductor substrate;

a semiconductor element formed in a surface region of the semiconductor substrate;

a first wiring layer comprising a gate electrode of the semiconductor element or a conductive portion connected to said gate electrode; a second wiring layer disposed above the first wiring layer;

a high strain region producing structure in said semiconductor substrate under a connecting portion that connects said first and second wiring layers to each other; and wherein a crystal defect is generated by said high strain region producing structure after heat processing, said crystal defect generation resulting in stress and strain in other surface regions of the semiconductor substrate being alleviated to deter formation of crystal defects in any remote operational region of the semiconductor device.

11. A device according to claim 10, wherein said surface region is a well layer and the high strain region producing structure is provided as a groove embedded with an insulating substance formed in said semiconductor substrate under said connecting portion so as to extend deeper into said semiconductor substrate than said well layer and the crystal defect is generated from a bottom portion of said groove.

12. A device according to claim 10, wherein said high strain region producing structure is provided as a high concentration impurity layer formed in said semiconductor substrate under said connecting portion and the crystal defect is generated from a bottom portion of said impurity layer.

13. A device according to claim 10, wherein said high stress region producing structure is provided as a groove extending deeper than said surface region into said semiconductor substrate, said groove having an abruptly varying groove width and a shape having at least one or more bottom corners and the crystal defect is generated from the at least one or more bottom corners.

14. A semiconductor device comprising:

a semiconductor substrate having a groove;

an element isolation region having an insulating film embedded in said groove of the semiconductor substrate;

an element region formed of a plurality of first impurity regions isolated by the element isolation region;

semiconductor elements respectively formed in said plurality of first impurity regions;

an ion implanted second region having an implanted impurity concentration higher than an impurity concentration of the first impurity regions, said second region surrounding a periphery of said element region and serving to attract impurities in said semiconductor substrate; and wherein a crystal defect is generated in said second region after heat processing resulting in strain in the element region of said semiconductor substrate being alleviated so that a crystal defect is not generated in the element region necessary for operation of said semiconductor elements.

15. A device according to claim 14, wherein said first impurity region is formed using ion implantation with a dosage of $3 \times 10 \cdot$ cm$^{-2}$ or less.

16. A device according to claim 14, wherein said second region is implanted with a dosage of $5 \times 10^{15}$ cm$^{-2}$ or more.

17. A device according to claim 14, wherein said second region is formed by introducing at least two impurities selected from the group consisting of boron, arsenic, phosphorus, germanium, antimony, argon, nitrogen and silicon, in an ion implanting method.

18. A device according to claim 14, wherein said semiconductor elements are formed into a memory cell array having cells at an outermost periphery of the memory cell array being ion implanted to form said second region.

19. A device according to claim 1, wherein said crystal defect is terminated at another bottom portion of said groove.

20. A device according to claim 1, wherein said semiconductor substrate has at least a second groove formed in the semiconductor substrate so that at least a bottom portion of the second groove extends deeper into the semiconductor substrate than the bottom boundary of the surface region and the crystal defect is terminated at the bottom portion of the second groove.

21. A device according to claim 1, wherein said semiconductor substrate includes a high strain region producing structure region and the crystal defect is terminated at said high strain region producing structure.

* * * * *